(12) United States Patent
Uebayashi et al.

(10) Patent No.: US 9,090,780 B2
(45) Date of Patent: Jul. 28, 2015

(54) GAS BARRIER FILM

(75) Inventors: Hiroyuki Uebayashi, Otsu (JP); Minoru Yoshida, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/342,103

(22) PCT Filed: Sep. 4, 2012

(86) PCT No.: PCT/JP2012/072446
§ 371 (c)(1),
(2), (4) Date: May 29, 2014

(87) PCT Pub. No.: WO2013/035689
PCT Pub. Date: Mar. 14, 2013

(65) Prior Publication Data
US 2014/0370260 A1    Dec. 18, 2014

(30) Foreign Application Priority Data

Sep. 7, 2011 (JP) .................................. 2011-194586
Sep. 7, 2011 (JP) .................................. 2011-194587
Sep. 27, 2011 (JP) .................................. 2011-210344

(51) Int. Cl.
| | | |
|---|---|---|
| B32B 7/02 | (2006.01) |
| B32B 9/04 | (2006.01) |
| B32B 15/04 | (2006.01) |
| B32B 19/00 | (2006.01) |
| C09D 1/00 | (2006.01) |
| B32B 9/00 | (2006.01) |
| C23C 14/56 | (2006.01) |
| C23C 14/08 | (2006.01) |
| C23C 16/455 | (2006.01) |
| C23C 14/06 | (2006.01) |
| C23C 14/10 | (2006.01) |
| C23C 14/34 | (2006.01) |

(52) U.S. Cl.
CPC ... *C09D 1/00* (2013.01); *B32B 9/00* (2013.01);
*C23C 14/0629* (2013.01); *C23C 14/08*
(2013.01); *C23C 14/081* (2013.01); *C23C
14/086* (2013.01); *C23C 14/10* (2013.01);
*C23C 14/3407* (2013.01); *C23C 14/562*
(2013.01); *C23C 16/45555* (2013.01); *Y10T
428/24992* (2015.01)

(58) Field of Classification Search
None
See application file for complete search history.

(56) References Cited

FOREIGN PATENT DOCUMENTS

| | | |
|---|---|---|
| JP | H08-142252 A | 6/1996 |
| JP | 2003-341003 A | 12/2003 |
| JP | 2004-66730 A | 3/2004 |
| JP | 2004-82522 A | 3/2004 |

(Continued)

OTHER PUBLICATIONS

International Search Report dated Oct. 30, 2012, application No. PCT/JP2012/072446.

*Primary Examiner* — David Sample
*Assistant Examiner* — Nicole T Gugliotta
(74) *Attorney, Agent, or Firm* — RatnerPrestia

(57) ABSTRACT

The present invention provides a gas barrier film which has high gas barrier performance and excellent repeated reproducibility of the gas barrier performance. A gas barrier film of the present invention comprises three inorganic compound layers (layer [A], layer [B] and layer [C]) that are sequentially arranged in this order on at least one surface of a polymer film base. The layer [B] has a thickness of 0.2-20 nm and a density that is higher than those of the layer [A] and the layer [C].

8 Claims, 2 Drawing Sheets

(56) References Cited

FOREIGN PATENT DOCUMENTS

| | | | |
|---|---|---|---|
| JP | 2005-103768 A | 4/2005 | |
| JP | 2006-299373 A | 11/2006 | |
| JP | 2007-083493 * | 4/2007 | ................ B32B 9/00 |
| JP | 2007-83493 A | 4/2007 | |
| WO | WO 2006/033233 A1 | 3/2006 | |
| WO | WO 2006/043333 A1 | 4/2006 | |
| WO | WO 2007/141994 A1 | 12/2007 | |
| WO | WO 2008/096615 A1 | 8/2008 | |

* cited by examiner

GAS BARRIER FILM

CROSS REFERENCE TO RELATED APPLICATIONS

This is the U.S. National Phase application of PCT International Application No. PCT/JP2012/072446, filed Sep. 4, 2012, and claims priority to Japanese Patent Application No. 2011-194586, filed Sep. 7, 2011, and Japanese Patent Application No. 2011-194587, filed Sep. 7, 2011 and Japanese Patent Application No. 2011-210344, filed Sep. 27, 2011, the disclosures of each of these applications being incorporated herein by reference in their entireties for all purposes.

FIELD OF THE INVENTION

The present invention relates to a gas barrier film to be used for packaging of foodstuffs and pharmaceuticals, electronic devices such as solar battery, electronic paper, and organic ELs, and other materials that are required to have high gas barrier properties.

BACKGROUND OF THE INVENTION

Transparent gas barrier films composed of a polymer film base having an deposited layer of an inorganic substance (or inorganic oxide) such as aluminum oxide, silicon oxide, and magnesium oxide formed on a surface thereof by a physical vapor deposition (PVD) technique such as vacuum deposition, sputtering, and ion plating, or a chemical vapor deposition (CVD) technique such as plasma chemical vapor deposition, thermochemical vapor deposition, and photochemical vapor deposition have been used as materials for packaging of foodstuffs and pharmaceuticals and for electronic devices such as Flat-screen TV and solar battery that are required to be impermeable to various gases including water vapor and oxygen.

Gas barrier properties improvement techniques that are available now include, for instance, forming a layer composed mainly of silicon oxide and a compound containing at least one of the group consisting of carbon, hydrogen, silicon, and oxygen on a base by the plasma CVD technique using a gas mixture containing vapor of an organic silicon compound and oxygen to achieve improved gas barrier properties while maintaining transparency (Patent document 1). $_0$Gas barrier properties improvement techniques that do not use a film formation process include stacking organic layers of an epoxy compound and silicon based oxide layers deposited by plasma CVD alternately on a base to produce a multi-layered gas barrier film that is free from cracks or defects caused by stress in the film.

PATENT DOCUMENTS

Patent document 1: Japanese Unexamined Patent Publication (Kokai) No. HEI-8-142252 (Claims)
Patent document 2: Japanese Unexamined Patent Publication (Kokai) No. 2003-341003 (Claims)

SUMMARY OF THE INVENTION

When a layer with gas barrier properties containing silicon oxide as primary component is formed by plasma CVD, however, the layer with gas barrier properties formed by this technique is very dense and very hard, and accordingly, it has to be thick in order to have good gas barrier properties with a water vapor transmission rate of $10^{-3}$ g/(m²·24 hr·atm) or less as required in organic EL and electronic paper.

In the case of a layer with gas barrier properties having a multi-layered laminate structure composed of organic layers and inorganic layers stacked alternately, on the other hand, the multi-layered laminate is required to have several tens of layers to realize good gas barrier properties with a water vapor transmission rate of $10^{-3}$ g/(m²·24 hr·atm) or less.

In view of such a prior art background, the present invention aims to provide a gas barrier film that achieves excellent gas barrier properties without having an increased thickness or multi-layered structure.

The present invention adopts the following measures to solve these problems. (1) Gas barrier film including a polymer base film laminated, on at least one of the surfaces thereof, with a gas barrier layer, the gas barrier layer having a layer structure in which a layer [A], a layer [B], and a layer [C] are stacked in this order on the polymer base film, the layer [A] and the layer [C] each having a density in the range of 2.0 to 9.0 g/cm³, and the layer [B] having a density that is in the range of 2.3 to 10.5 g/cm³ and higher than the densities of the layer [A] and layer [C] and having a thickness of 0.2 to 20 nm.
(2) Gas barrier film as described in paragraph (1), wherein the density of the layer [A] is higher than the density of the layer [C].
(3) Gas barrier film as described in either paragraph (1) or (2), wherein the density of the layer [B] is higher by 0.1 to 4.0 g/cm³ than the density of the layer [A].
(4) Gas barrier film as described in paragraph (1), wherein the layer [A] and the layer [B] contain a zinc (Zn) compound as the primary component while the layer [C] contains, as the primary component, a compound containing at least one element selected from the group consisting of silicon (Si), aluminum (Al), titanium (Ti), zirconium (Zr), and chromium (Cr), the density of the layer [B] being higher by 0.1 to 2.0 g/cm³ than the density of the layer [A].
(5) Gas barrier film as described in paragraph (4), wherein the density of the layer [A] is 3.9 to 4.6 g/cm³; the density of the layer [B] is 4.0 to 5.8 g/cm³; and the density of the layer [C] is 2.0 to 5.5 g/cm³.
(6) Gas barrier film as described in paragraph (5), wherein the layer [C] contains a silicon (Si) compound as the primary component and has a density of 2.0 to 2.6 g/cm³.
(7) Gas barrier film as described in paragraph (5), wherein the layer [C] contains a compound containing at least one element selected from the group consisting of aluminum (Al), titanium (Ti), zirconium (Zr), and chromium (Cr) as the primary component and has a density of 3.5 to 5.5 g/cm³.
(8) Gas barrier film as described in any one of paragraphs (1) to (7), wherein the layer [A] is either a layer [A1] or a layer [A2] as specified below:
layer [A1]: a layer of a phase in which zinc oxide, silicon dioxide, and aluminum oxide coexist,
layer [A2]: a layer of a phase in which zinc sulfide and silicon dioxide coexist.
(9) Gas barrier film as described in paragraph (8), wherein the layer [A] is a layer [A1] as specified above and has a zinc (Zn) atom concentration of 20 to 40 atom %, a silicon (Si) atom concentration of 5 to 20 atom %, an aluminum (Al) atom concentration of 0.5 to 5 atom %, and an oxygen (O) atom concentration of 35 to 70 atom % as determined by ICP emission spectroscopy analysis.
(10) Gas barrier film as described in paragraph (8), wherein the layer [A] is a layer [A2] as specified above in which zinc sulfide accounts for a mole fraction of 0.7 to 0.9 of the total for zinc sulfide and silicon dioxide.

It is possible to provide a gas barrier film that has high gas barrier properties against water vapor.

DETAILED DESCRIPTION OF EMBODIMENTS OF THE INVENTION

[Gas Barrier Film]

As a result of intensive studies on the layer structure of gas barrier films with the aim of developing a good gas barrier film with high transparency and high water vapor barrier properties, the inventors found that all the problems described above can be solved by a gas barrier film with a layered structure that includes a polymer base film laminated, on at least one of the surfaces thereof, with a gas barrier layer, the gas barrier layer having a layer structure in which inorganic compound layers [A], [B], and [C] in contact with each other are stacked in this order on the polymer base film, the layer [A] and the layer [C] each having a density in the range of 2.0 to 9.0 $g/cm^3$, and the layer [B] having a density that is in the range of 2.3 to 10.5 $g/cm^3$ and higher than the densities of the layer [A] and layer [C] and having a thickness of 0.2 to 20 nm.

Here, the inorganic compound layers [A], [B], [C] contained in the gas barrier layer according to the present invention each have a thickness and a density that can be determined through analysis using the X-ray reflectivity technique according to the procedure described later.

Figure 1:
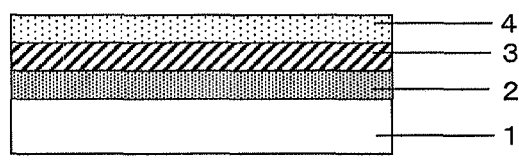
FIG. 1 is an exemplary schematic diagram of a cross section of the gas barrier film according to an embodiment of the present invention.

FIG. 1 is an exemplary schematic diagram of a cross section of the gas barrier film according to an embodiment of the present invention. As seen from FIG. 1, the gas barrier film has a gas barrier layer of a layered structure that includes a polymer base film 1 and inorganic compound layers [A] 2, [B] 3, and [C] 4, in contact with each other, stacked in this order on the surface of the polymer base film. The example given in FIG. 1 shows a minimum structure of the gas barrier film in which only a gas barrier layer composed of a layer [A] 2, layer [B] 3, and layer [C] 4 is disposed on one side of the polymer base film 1. However, another layer may be provided between the polymer base film 1 and the layer [A] 2 or on the surface of the layer [C] 4 opposite to the layer [B] 3.

As described in detail later, the layer [A] and the layer [C] each have a density in the range of 2.0 to 9.0 $g/cm^3$. Here, the density of the layer [A] may be equal to or different from that of the layer [C]. When a layer [B] having a thickness of 0.2 to 20 nm and having a density that is in the range of 2.3 to 10.5 $g/cm^3$ and at the same time higher than the densities of such a layer [A] and layer [C] was provided between the latter layers, it was found that the resulting gas barrier film had very high water vapor barrier properties that cannot be achieved in a gas barrier film including a single gas barrier layer composed only of a layer [A] or a layer [C] or including a two-layered gas barrier layer composed of a layer [A] and a layer [C]. The reason why such a noticeable effect can be realized is inferred as follows. Specifically, being disposed under the layer [B], the layer [A] prevents the polymer film or the underlying layer under the layer [A] from suffering from thermal changes in dimension caused by thermal influence of the deposition source, plasma, or heated source used for forming the layer [B]. Accordingly, the formation of cracks and defects in the layer [B] is prevented, allowing the layer [B] to have a high density and to be produced with high reproducibility. Being formed of an inorganic compound with a higher density than that of the layer [A], the layer [B] has a structure with a larger mass per unit volume and a higher degree of denseness than those of the layer [A]. Furthermore, being disposed on the layer [B], the layer [C] prevents the layer [B] from suffering from a decrease in density caused by foreign objects and dirt coming from the external air.

Here, the polymer base film 1 may be provided with a gas barrier layer only on one surface, but may be provided with gas barrier layers on both surfaces of the polymer base film with the aim of controlling the stress in the case where the gas barrier film with only one surface suffers from warp and deformation as a result of disruption in stress balance between the gas barrier layer side and the opposite side.

For the gas barrier layer used for the present invention, furthermore, the density of the layer [A] is preferably higher than that of the layer [C] from the viewpoint of improving the gas barrier properties.

For the present invention, the thickness and density of the layer [A], layer [B], and layer [C] are determined by the X-ray reflectivity technique (see "X-sen Hansharitsu Nyumon" (Introduction to X-ray Reflectivity), edited by Kenji Sakurai, pp. 51-78).

Specifically, X-ray is first generated by an X-ray source, collimated by a multilayer mirror to produce a parallel beam, allowed to pass through an entrance slit for control of the X-ray angle, and led to the specimen under measurement. If the incident X-ray beam to the specimen has a very small incidence angle so as to be nearly parallel to the specimen surface, many reflected beams are produced at the interfaces between the layers and between the base and the overlying layer and they interfere with each other. The resulting reflected beams are guided through a light receiving slit to limit the X-ray beams to a necessary angle range, and then guided into a detector for measuring the X-ray intensity. In this method, the X-ray incidence angle is changed continuously to obtain X-ray intensity profiles at various incidence angles.

To analyze the number of layers, and the thickness and density of each layer, the measured data of the resulting X-ray intensity profiles observed at various X-ray incidence angles are fitted to the Parratt's theoretical formula by the nonlinear least-squares method. For the fitting, an arbitrary initial value is set for each parameter, that is, the number of layers, and the thickness and density of each layer, and the final value of the parameter is determined by adjusting it so that the standard deviation of the difference between the X-ray intensity profile calculated for an assumed structure and the measured data comes to a minimum. For the present invention, each parameter, that is, the number of layers, and the thickness and density of each layer, is determined by performing the fitting so that the standard deviation of the difference comes to 3.0% or less at a minimum number of laminated layers. As the initial values of the parameters used for the fitting, measurements of the specimen taken by TEM cross-sectional observation are used for the number of the layers and the thickness of each layer, while a value based on the element ratio derived from XPS analysis at the half thickness position is used for the density of each layer identified by TEM cross-sectional observation. For Examples given in the present application, fitting was carried out by using Rigaku Grobal Fit analysis software attached to the equipment used for the X-ray reflection measurement SmartLab manufactured by Rigaku). This analysis software performs the fitting for a fixed number of layers, and therefore, if the standard deviation of the difference does not reach 3.0% or less by the fitting for an assumed number of layers (referred to here as n layers), the layer having the highest theoretical density in the initial layer structure is divided equally into two layers and the fitting is carried out for the structure with an additional layer (having n+1 layers). This procedure is repeated until the standard deviation of the difference comes to 3.0% or less. Actually, any similar procedure based on the same concept may be performed using appropriate analysis software.

Since for the present invention, the number of layers in the gas barrier layer is determined by the method described above, the total number of layers forming the gas barrier layer obtained by TEM cross-sectional observation may differ in some cases from the total number of layers forming the gas barrier layer obtained by the X-ray reflectivity technique adopted for the present invention. Even in the case where the total number of layers determined by TEM cross-sectional observation is, for instance, one or two for an embodiment of the present invention, the embodiment is acceptable if three layers are identified by the X-ray reflectivity technique as illustrated in FIG. 1 and the density and thickness of the layer [A], layer [B], and layer [C] meet the requirements described above. If a total of four layers or more are identified by the X-ray reflectivity technique, the embodiment is acceptable if it includes at least one gas barrier layer that contains a layer [A], layer [B], and layer [C] that meet the requirements described above. In the case where, for instance, a total of four layers are identified by the X-ray reflectivity technique, three layers having a density and thickness that meet the requirements described above may constitute a gas barrier layer in contact with the base or they may be the outermost layers. If a total of five layers or more are identified by the X-ray reflectivity technique, the embodiment is acceptable if it includes at least one set of a layer [A], layer [B], and layer [C] that meet the requirements described above.

A gas barrier layer used for the present invention preferably has a thickness (total thickness of layer [A], layer [B], and layer [C]) of 10 nm or more, more preferably 50 nm or more. If the gas barrier layer has a thickness of less than 10 nm, a sufficiently high degree of gas barrier properties may not be maintained at some positions, leading to problems such as uneven gas barrier properties over the plane of the polymer base film. It is preferably 2,000 nm or less, and more preferably 1,000 nm or less. If the thickness of the gas barrier layer is more than 2,000 nm, a large residual stress will take place in the layer, and cracks will be generated easily in the gas barrier layer under bending and external impact, possibly leading to deterioration in the gas barrier properties in the course of long-term use.

[Polymer Base Film]

There are no specific limitations on the polymer base film to be used for the present invention as long as it is a film of an organic polymer compound, and useful film materials include, for instance, polyolefins such as polyethylene and polypropylene; polyesters such as polyethylene terephthalate and polyethylene naphthalate; and various other polymers such as polyamide, polycarbonate, polystyrene, polyvinyl alcohol, saponification products of ethylene vinyl acetate copolymers, polyacrylonitrile, and polyacetal. Of these, it is preferably a film of polyethylene terephthalate. The polymer constituting the base film may be either a homopolymer or a copolymer, and it may be either a single polymer or a mixture of a plurality of polymers.

Furthermore, the polymer base film may be a monolayer film, a two or more layered film produced by coextrusion, or a uniaxially or biaxially stretched film. The surface of the base that is to be laminated with an inorganic compound layer may be pre-treated to ensure good contact by such techniques as corona treatment, ion bombardment treatment, solvent treatment, surface roughening treatment, and formation of an anchor coat layer of an organic substance, inorganic substance, or mixture thereof. In addition, the surface opposite to the one to be laminated with an inorganic compound layer may be coated with an organic substance, inorganic substance, or mixture thereof with the aim of improving the slipping during the winding-up step and decreasing the friction, during the winding-up step, with the inorganic compound layer formed before the winding-up step.

There are no specific limitations on the thickness of the polymer base film to be used for the present invention, but it is preferably 500 μm or less and more preferably 200 μm or less from the viewpoint of maintaining a required flexibility. From the viewpoint of maintaining a required strength to resist tensile force and impact, it is preferably 5 μm or more, and more preferably 10 μm or more. To ensure a required film processability and handleability, furthermore, it is still more preferably 10 μm to 200 μm.

Layer [A]

The layer [A] is disposed on the polymer base film. Materials useful for the layer [A] for the present invention include, for instance, oxides, nitrides, oxynitrides, and sulfides containing one or more elements selected from the group consisting of Zn, Si, Al, Ti, Zr, Sn, In, Nb, Mo, and Ta, and mixtures thereof. Zinc compounds that contain, as the primary component, an oxide, nitride, oxynitride, or sulfide of zinc have been preferred because they serve to produce a layer with high gas barrier properties and flexibility. Here, the term "primary" means that the component accounts for 60 mass % or more, preferably 80 mass % or more, of the whole layer [A]. Here, the composition of the compound that is used as the primary component is determined by such undermentioned methods as X-ray photoelectron spectroscopy (XPS), ICP emission spectroscopy, and Rutherford backscattering analysis. Although the composition ratio of the elements that constitute the aforementioned compound may slightly differ from the stoichiometric mixture ratio depending on the conditions used for the formation of the layer [A], it is assumed here (and hereinafter) that the compound is represented by a composition formula in which the composition ratio consists only of integers.

For instance, preferred layers that serve for achieving high gas barrier properties include one composed of a phase in which zinc oxide, silicon dioxide, and aluminum oxide coexist (hereinafter referred to as layer [A1]) and one composed of a phase in which zinc sulfide and silicon dioxide coexist (hereinafter referred to as layer [A2]) (the layer [A1] and the layer [A2] will be described in detail later).

For the present invention, the thickness and density of the layer [A] are determined by the aforementioned X-ray reflectivity technique.

The layer [A] used for the present invention preferably has a thickness of 10 nm or more, more preferably 100 nm or more. If the layer has a thickness of less than 10 nm, a sufficiently high degree of gas barrier properties may not be maintained at some positions, leading to problems such as uneven gas barrier properties over the plane of the gas barrier film. The layer [A] preferably has a thickness of 1,000 nm or less, more preferably 500 nm or less. If the thickness of the layer is more than 1,000 nm, a large residual stress will take place in the layer, and cracks will be generated easily in the layer [A] under bending and external impact, possibly leading to deterioration in the gas barrier properties in the course of long-term use.

The density of the layer [A] as measured by the X-ray reflectivity technique is preferably in the range of 2.0 to 9.0 g/cm$^3$. If the density of the layer [A] is less than 2.0 g/cm$^3$, the inorganic compound contained in the layer [A] will have an increased particle size and the portions occupied by gaps and defects will increase relatively, possibly making it difficult to maintain required gas barrier properties stably. If the density of the layer [A] is more than 9.0 g/cm$^3$, the inorganic compound contained in the layer [A] will have a decreased particle size and the layer will have excessively dense film properties, often leading to the generation of cracks under heat or external stress. Accordingly, the layer [A] should have a density of 2.0 to 9.0 g/cm$^3$, preferably in the range of 2.8 to 9.0 g/cm$^3$, and more preferably in the range of 3.5 to 7.0 g/cm$^3$.

There are no specific limitations on the method to be used for forming the layer [A], and useful formation methods include, for instance, vacuum deposition, sputtering, ion plating, and CVD. Of these methods, sputtering is preferable as a method for forming a layer [A] by a simple, low-cost process.

[Layer B]

The layer [B] has a thickness of 0.2 to 20 nm and a density higher than that of layer [A] and layer [C] and is located between, and in contact with, layer [A] and layer [C]. The arrangement of the layer [B] between, and in contact with, layer [A] and layer [C], allows the gas barrier layer to have dramatically improved gas barrier properties while maintaining flexibility. Materials useful for the layer [B] for the present invention include, for instance, oxides, nitrides, oxynitrides, and sulfides containing one or more elements selected from the group consisting of Zn, Si, Al, Ti, Zr, Sn, In, Nb, Mo, and Ta, and mixtures thereof. In regard to the composition of the layer [B], its composition ratio can be determined through quantitative analysis of the atoms of each element by such methods as X-ray photoelectron spectroscopy (XPS), ICP emission spectroscopy, and Rutherford backscattering analysis, which may be used singly or in combination.

The thickness and density of the layer [B] are determined by the aforementioned X-ray reflectivity technique. The density of the layer [B] as measured by the X-ray reflectivity technique is preferably in the range of 2.3 to 10.5 g/cm$^3$. If the layer [B] has a density of less than 2.3 g/cm$^3$, the inorganic compound contained in the layer [B] will have an increased particle size, leading to a reduced effect for improving the gas barrier properties. If the layer [B] has a density of more than 10.5 g/cm$^3$, the whole layer [B] will have excessively dense film properties and decreased flexibility, leading to a gas barrier film with decreased flexibility under mechanical bending in spite of being located between a low-density layer [A] and layer [C]. Accordingly, the layer [B] should have a density in the range of 2.3 to 10.5 g/cm$^3$, preferably in the range of 2.9 to 10.5 g/cm$^3$, and more preferably in the range of 4.0 to 7.0 g/cm$^3$.

The density of the layer [B] measured by the X-ray reflectivity technique is preferably higher by 0.1 to 4.0 g/cm$^3$ than the density of the layer [A]. If the density difference calculated by subtracting the density of the layer [A] from that of the layer [B] is less than 0.1 g/cm$^3$, the effect of arranging a high-density layer between the layer [A] and the layer [C] will be small, leading to limited improvement in gas barrier properties. On the other hand, if the density difference calculated by subtracting the density of the layer [A] from that of the layer [B] is more than 4.0 g/cm$^3$, the inorganic compound contained in the layer [B] will have a decreased particle size and the layer will have excessively dense film properties, often leading to the generation of cracks under heat or external stress. Accordingly, it is preferable that the density of the layer [B] be higher by 0.1 to 4.0 g/cm$^3$, more preferably by 0.4 to 2.0 g/cm$^3$, than that of the layer [A].

The layer [B] used for an embodiment of the present invention has a thickness in the range of 0.2 to 20 nm. If the thickness of the layer [B] is less than 0.2 nm, the layer [B] may fail to have improved gas barrier properties, leading to problems such as uneven gas barrier properties over the plane of the polymer base film. On the other hand, if the thickness of the layer is more than 20 nm, the particles of the inorganic compound grow in the layer [B] to make the surface of the layer [B] less flat, and the atoms and particles that act as nuclei for film growth will be prevented from moving and diffusing in the surface during the initial film growth step in the layer [C] formation process, possibly failing to develop dense film properties around the layer [B] and achieve adequate gas barrier properties improving effect. Accordingly, the layer [B] should have a thickness in the range of 0.2 to 20 nm, preferably in the range of 2 to 10 nm.

There are no specific limitations on the method to be used to form the layer [B] for the present invention and useful methods include, for instance, vacuum deposition, sputtering, and ion plating using a relatively high-density material, and plasma assisted deposition, plasma assisted sputtering, ion beam assisted deposition, ion beam assisted sputtering, ion beam assisted ion plating, and ion beam assisted CVD which can serve to form a higher-density layer [B] from the same material as above while processing the surface of the layer [A] with ion beam or plasma of a reactive gas such as oxygen gas and carbon dioxide gas.

In addition, the surface of the layer [A] may be pre-treated by such techniques as corona treatment, ion bombardment treatment, solvent treatment, and surface roughening treatment before the formation of the layer [B].

Layer [C]

The layer [C] is located on the layer [B] and has a density in the range of 2.0 to 9.0 g/cm$^3$. The density of the layer [C] may be equal to or different from the density of the layer [A] as long as it is in the aforementioned range, although it is preferable for the layer [A] to have a density higher than that of the layer [C] as described previously.

Materials useful for the layer [C] for the present invention include, for instance, oxides, nitrides, oxynitrides, and sulfides containing one or more elements selected from the group consisting of Zn, Si, Al, Ti, Zr, Sn, In, Nb, Mo, and Ta, and mixtures thereof. Silicon compounds containing, as the primary component, an oxide, nitride, oxynitride, or sulfide of silicon have been preferred because they ensure high gas barrier properties as well as increased dense properties brought about by a flat surface of the layer [B]. Here, the term "primary" means that the component accounts for 60 mass % or more, preferably 80 mass % or more, of the whole layer [C]. Here, the composition of the compound that is used as the primary component is determined by such undermentioned methods as X-ray photoelectron spectroscopy (XPS), ICP emission spectroscopy, and Rutherford backscattering analysis. Although the composition ratio of the elements that constitute the aforementioned compound may slightly differ from the stoichiometric mixture ratio depending on the conditions used for the formation of the layer [C], it is assumed here that the compound is represented by a composition formula in which the composition ratio consists only of integers.

In regard to the composition of the layer [C], it is preferable for the layer to contain a silicon oxide in which the ratio of the number of oxygen atoms to that of the silicon atoms is 1.5 to 2.0. If the ratio of the number of silicon atoms to that of the oxygen atoms is more than 2.0, the oxygen atoms contained accounts for an excessively large proportion and accordingly, the portions occupied by voids and defects will increase, possibly making it impossible to develop required gas barrier properties. If the ratio of the number of silicon atoms to that of the oxygen atoms is less than 1.5, on the other hand, the number of oxygen atoms will be small and accordingly, the film will have dense properties, but may be too low in flexibility. The ratio is more preferably 1.4 to 1.8.

In regard to the composition analysis of the layer [C], the quantity of the atoms of each element can be determined by applying X-ray photoelectron spectroscopy (XPS), ICP emission spectroscopy, and Rutherford backscattering analysis depending on the composition. If another layer exists on the layer [C], the surface laminar portion with a thickness determined by the X-ray reflectivity technique is removed by ion etching or chemical treatment, and analysis is performed thereafter.

For the present invention, the thickness and density of the layer [C] can be determined by the aforementioned X-ray reflectivity technique.

The layer [C] used for the present invention preferably has a thickness of 10 nm or more, more preferably 100 nm or more. If the layer has a thickness of less than 10 nm, a sufficiently high degree of gas barrier properties may not be maintained at some positions, leading to problems such as uneven gas barrier properties over the plane of the gas barrier film. The layer [C] preferably has a thickness of 1,000 nm or less, more preferably 500 nm or less. If the thickness of the layer is more than 1,000 nm, a large residual stress will take place in the layer, and cracks will be generated easily in the layer [C] under bending and external impact, possibly leading to deterioration in the gas barrier properties in the course of long-term use.

The density of the layer [C] as measured by the X-ray reflectivity technique is in the range of 2.0 to 9.0 g/cm$^3$. If the density of the layer [C] is less than 2.0 g/cm$^3$, the inorganic compound in the layer [C] will have an increased particle size and the portions occupied by gaps and defects will increase, making it difficult to obtain required gas barrier properties. If the density of the layer [C] is more than 9.0 g/cm$^3$, the layer [C] will have a large mass per unit volume and accordingly, the atoms and particles that act as nuclei for film growth will not be moved and diffused easily in the surface by the effect of a flat surface of the layer [B], possibly failing to develop dense film properties around the layer [B] and achieve adequate gas barrier properties improving effect. Accordingly, the layer [C] should have a density in the range of 2.0 to 9.0 g/cm$^3$, preferably in the range of 2.0 to 6.0 g/cm$^3$, and more preferably in the range of 2.0 to 2.6 g/cm$^3$.

There are no specific limitations on the method to be employed to produce the layer [C] used for the present invention, and useful production methods include, for instance, vacuum deposition, sputtering, and ion plating.

[Layer [A] and Layer [B] Containing a Zinc Compound as the Primary Component]

The layer [A], layer [B], and layer [C] are described separately above. Preferred combinations of the layer [A], layer [B], and layer [C] are explained below.

To obtain further improved gas barrier properties, the gas barrier layer is preferably such that the layer [A] and the layer [B] contain a zinc (Zn) compound as the primary component while the layer [C] contains, as the primary component, a compound containing at least one element selected from the group of silicon (Si), aluminum (Al), titanium (Ti), zirconium (Zr), and chromium (Cr), the density of the layer [B] being higher by 0.1 to 2.0 g/cm$^3$ than the density of the layer [A].

The reason why a larger effect can be realized by this embodiment is inferred as follows. Concretely, the layer [A] and the layer [B] are low-hardness layers containing a zinc compound as the primary component, and the layer [B] is higher in density by 0.1 to 2.0 g/cm$^3$ than that of the layer [A], though it contains a zinc compound as the primary component as in the case of the layer [A]. This means that the layer [B] has a dense structure in which defective portions in the layer material, which contains a zinc compound as the primary component, are filled with other substances, and it is expected that this structure is acting to further improve the gas barrier properties.

Preferred methods for forming the layer structure according to the embodiment are described below. A gas barrier layer is formed by first carrying out a first layer formation step for forming a layer having a zinc compound as the primary component on a polymer base film and then carrying out a second layer formation step for forming a layer having, as the primary component, a compound containing at least one element selected from the group of silicon (Si), aluminum (Al), titanium (Ti), zirconium (Zr), and chromium (Cr). The layer formed in the first layer formation step will constitute the layer [A] and the layer [B] after the second layer formation step. In the second layer formation step, the layer [C] is formed while in the layer formed in the first layer formation step, the surface laminar region of the layer [C] is converted into the layer [B]. In this regard, the layer formed in the first layer formation step where the surface laminar region has not been converted into the layer [B] is referred to as "the first layer", which is distinguished from "the layer originating from the first layer formation step" which collectively refers to the layer [A] and the layer [B] after the second layer formation step.

The first layer is a low-hardness layer having a zinc compound as the primary component, and accordingly, in the second layer formation step, particles of the primary component of the second layer, that is, a compound having at least one element selected from the group of silicon (Si), aluminum (Al), titanium (Ti), zirconium (Zr), and chromium (Cr), moves and enters into the surface laminar region of the first layer. Thus, it is inferred that defective portions existing in the surface of the first layer are efficiently filled with other substances, thereby converting the region into a layer [B]. Consequently, the first layer is expected to have a structure in which the layer [A] located on the polymer base film is overlaid with the layer [B] which has a high density and high denseness, leading to further improved gas barrier properties attributable to the existence of the layer [B] which has a high density and high denseness. For this second layer formation step, the primary component in the second layer is preferably a compound containing elements with a small atom radius, particularly preferably a compound containing the silicon atom, so that defects in the surface of the first layer are filled with particles that can form a thin film efficiently.

Here, the first layer formation step and the second layer formation step are described here with the aim of showing a preferable method for forming a layer [A], layer [B], and layer [C], and needless to say, the boundaries between the layer [A], layer [B] and, layer [C] should be identified on the basis of analysis by the X-ray reflectivity technique.

Described below is the layer originating from the first layer formation step (layer [A] and layer [B]) and the layer formed in the second layer formation step (layer [C]).

[Layer Originating from the First Layer Formation Step (Layer [A] and Layer [B])]

As a result of their studies, the inventors found that a gas barrier layer with dramatically improved gas barrier properties can be produced if a layer having, as the primary component, a compound containing at least one element selected from the group of silicon (Si), aluminum (Al), titanium (Ti), zirconium (Zr), and chromium (Cr) is formed under specific conditions in a second the layer formation step on a first layer having a zinc compound as the primary component. Here (and hereinafter), the term "primary' means that the component accounts for 60 mass % or more, preferably 80 mass % or more, of the layer. It should be noted that a zinc compound as referred to for the present invention is one that is represented by a composition formula in which the composition ratio among the elements identified by a method as described below such as X-ray photoelectron spectroscopy (XPS), ICP emission spectroscopy, and Rutherford backscattering analysis consists only of integers. For instance, even in the case where the composition ratio of ZnS, ZnO, etc. slightly differs from the stoichiometric mixture ratio depending on the production conditions, the compounds are assumed to be ZnS, ZnO, etc. in calculating the aforementioned mass content.

There are no specific limitations on the method to be used for the first layer formation step, and applicable methods include, for instance, vacuum deposition, sputtering, ion plating, and CVD. Of these methods, sputtering is preferable as a method for carrying out the first layer formation step by a simple, low-cost process.

In this preferred embodiment as well, the layer [B] preferably has a thickness of 0.2 to 20 nm. If the thickness is less than 0.2 nm, voids and defects will take place, making it difficult to improve the gas barrier properties. If the thickness is more than 20 nm, on the other hand, the particles contained in the layer [B] will grow to a large size, and accordingly, defective portions will be formed in the film while impeding the formation of the second layer, leading to problems such as deterioration in the gas barrier properties. Thus, the layer [B] should have a thickness in the range of 0.2 to 20 nm, preferably in the range of 2 to 10 nm.

The density of the layer [B] is preferably higher by 0.1 to 2.0 $g/cm^3$ than the density of the layer [A]. If the density difference from the layer [A] is less than 0.1 $g/cm^3$, the defective portions existing in the surface of the first layer may not be filled sufficiently with a compound containing at least one element selected from the group of silicon (Si), aluminum (Al), titanium (Ti), zirconium (Zr), and chromium (Cr), resulting in poor improvement in the gas barrier properties. If the density difference from the layer [A] is more than 2.0 $g/cm^3$, the layer [B] will have excessively dense film properties and decreased flexibility and suffer from cracks under bending and external impact, leading to problems such as deterioration in the gas barrier properties. Accordingly, it is preferable that the density of the layer [B] be higher by 0.1 to 2.0 $g/cm^3$, more preferably by 0.2 to 1.0 $g/cm^3$, than that of the layer [A].

The first layer may contain oxides, nitrides, oxynitrides, and sulfides of Zn, Si, Al, Ti, Zr, Sn, In, Nb, Mo, or Ta, or mixtures thereof as long as it contains a zinc compound as the primary component. For instance, preferred layers that serve for achieving high gas barrier properties include one composed of a phase in which zinc oxide, silicon dioxide, and aluminum oxide coexist (hereinafter referred to as layer [A1]) and one composed of a phase in which zinc sulfide and silicon dioxide coexist (hereinafter referred to as layer [A2]) (the layer [A1] and the layer [A2] will be described in detail later).

The first layer and the layer [A] preferably has a density in the range of 3.9 to 4.6 $g/cm^3$. If the density of the layer [A] is less than 3.9 $g/cm^3$, the layer [A] will deteriorate in dense film properties and the portions occupied by gaps and defects will increase, possibly making it difficult to maintain required gas barrier properties. If the density of the layer [A] is more than 4.6 $g/cm^3$, the layer [A] will have excessively dense film properties, possibly leading to the generation of cracks under heat or external stress. Accordingly, the layer [A] preferably has a density of 3.9 to 4.6 $g/cm^3$, more preferably in the range of 4.0 to 4.5 $g/cm^3$.

The density of the layer [B] determined by the X-ray reflectivity technique is preferably 4.0 $g/cm^3$ or more, more preferably 4.4 $g/cm^3$ or more, and still more preferably 4.5 $g/cm^3$ or more. If the layer [B] has a density of 4.0 $g/cm^3$ or more, the portions occupied by voids and defects existing in the surface of the first layer are filled more rapidly with the compound containing at least one element selected from the group of silicon (Si), aluminum (Al), titanium (Ti), zirconium (Zr), and chromium (Cr), and accordingly, the layer [B] will have more improved dense film properties, leading to dramatically improved gas barrier properties. On the other hand, the density of the layer [B] determined by the X-ray reflectivity technique is preferably 5.8 $g/cm^3$ or less, more preferably 5.5 $g/cm^3$ or less, still more preferably 4.8 $g/cm^3$ or less, and particularly preferably 4.7 $g/cm^3$ or less. If the layer [B] has a density of 5.8 $g/cm^3$ or less, the layer [B] will be prevented from becoming excessively dense, and the generation of cracks during the second layer formation step will be depressed.

[Second Layer Formation Step <1>]

In a preferred embodiment of this invention, the layer formed on the first layer in the second layer formation step has, as the primary component, a compound containing at least one element selected from the group of silicon (Si), aluminum (Al), titanium (Ti), zirconium (Zr), and chromium (Cr). Of these, the case where a silicon (Si) compound is the primary component is described first. The layer formed on the first layer in the second layer formation step is hereinafter referred to as the layer [C]. As described above, if the surface of the first layer is treated under specific conditions in the second layer formation step, the laminar region of the first layer in contact with the layer [C] is converted into a dense layer [B] with a high density, leading to dramatically improved gas barrier properties. It should be noted that a silicon compound used for the present invention is one that is represented by a composition formula in which the composition ratio among the elements identified by a method as described below such as X-ray photoelectron spectroscopy (XPS), ICP emission spectroscopy, and Rutherford backscattering analysis consists only of integers. In the case of silicon dioxide ($SiO_2$), for instance, a substance having a composition ratio slightly differing from that based on the silicon-oxygen ratio in the above composition (between SiO and $SiO_2$) may result depending on the production conditions adopted, but such a compound is assumed to be $SiO_2$ in calculating the aforementioned mass content.

In regard to the composition of the layer [C] in this preferred embodiment, it is preferable for the layer to contain a silicon oxide in which the ratio of the number of oxygen atoms to that of the silicon atoms is 1.5 to 2.0. If the ratio of the number of oxygen atoms to that of the silicon atoms is more than 2.0, the oxygen atoms contained accounts for an excessively large proportion and accordingly, the portions occupied by voids and defects will increase, possibly making it impossible to develop required gas barrier properties. If the ratio of the number of oxygen atoms to that of the silicon atoms is less than 1.5, on the other hand, the number of oxygen atoms will be small and accordingly, the film will have dense properties, but may be too low in flexibility. The ratio is more preferably in the range of 1.7 to 1.9.

For the present invention, the thickness and density of the layer [C] used in the preferred embodiment can be determined by the X-ray reflectivity technique as described above.

In this preferred embodiment as well, the layer [C] has a thickness in the aforementioned range.

In this preferred embodiment, the density of the layer [C] as measured by the X-ray reflectivity technique is preferably in the range of 2.0 to 2.6 g/cm$^3$. If the density of the layer [C] is less than 2.0 g/cm$^3$, the layer [C] will deteriorate in dense film properties and the portions occupied by gaps and defects will increase, possibly making it difficult to maintain required gas barrier properties. If the density of the layer [C] is more than 2.6 g/cm$^3$, the layer [C] will have excessively dense film properties, possibly leading to the generation of cracks under heat or external stress. Accordingly, the layer [C] preferably has a density of 2.0 to 2.6 g/cm$^3$, more preferably in the range of 2.3 to 2.5 g/cm$^3$.

There are no specific limitations on the method to be applied to carry out the second layer formation step, and useful layer formation methods include, for instance, vacuum deposition, sputtering, ion plating, chemical vapor deposition (abbreviated as CVD). The second layer formation step is preferably carried out under appropriate conditions, for example, using a deposition material with a low melting point, performing the deposition under reduced pressure, and adopting high-energy activation settings so that particles can efficiently fill the defects existing in the surface laminar region of the first layer to convert it into a layer [B].

In the case where sputtering is performed, it is preferable that while the defects existing in the surface laminar region of the first layer are filled with particles to form a layer [B], the plasma assisted sputtering technique be adopted for the production of the second layer. Concretely, in addition to using plasma for sputtering of the target material, plasma of reactive gas, such as oxygen gas and carbon dioxide gas, is used to assist the processing of the surface of the first layer so that the surface diffusion of particles for constituting a second layer is promoted to ensure the formation of a second layer with dense film properties. In the case where CVD is performed, it is preferable that a silicon-based organic compound monomer in a gas state is activated by high-intensity plasma so that a dense silicon-based thin film layer is formed through a polymerization reaction. Of these methods, it is preferable to adopt the CVD technique in the second layer formation step for the present invention to produce a dense silicon-based thin film layer through a polymerization reaction by applying activated high-intensity plasma of a silicon-based organic compound monomer in a gas state because the defects in the first layer surface can be efficiently filled to ensure dramatically improved gas barrier properties.

The silicon-based organic compound referred to above is a compound containing a silicon atom in its molecule, and its examples include, for instance, silane, methyl silane, dimethyl silane, trimethyl silane, tetramethyl silane, ethyl silane, diethyl silane, triethyl silane, tetraethyl silane, propoxy silane, dipropoxy silane, tripropoxy silane, tetrapropoxy silane, dimethyl disiloxane, tetramethoxy silane, tetraethoxy silane, tetrapropoxy silane, tetramethyl disiloxane, hexamethyl disiloxane, tetramethoxy silane, tetraethoxy silane, tetrapropoxy silane, hexamethyl cyclotrisiloxane, octamethyl cyclotetrasiloxane, decamethyl cyclopentasiloxane, undecamethyl cyclohexasiloxane, dimethyl disilazane, trimethyl disilazane, tetramethyl disilazane, hexamethyl disilazane, hexamethyl cyclotrisilazane, octamethyl cyclotetrasilazane, decamethyl cyclopentasilazane, and undecamethyl cyclohexasilazane. Of these, hexamethyl disiloxane and tetraethoxysilane are preferable from the viewpoint of safety in handling.

[Second Layer Formation Step <2>]

For the preferred embodiment of this invention in which the layer formed on the first layer in the second layer formation step has, as primary component, a compound containing at least one element selected from the group of silicon (Si), aluminum (Al), titanium (Ti), zirconium (Zr), and chromium (Cr), cases where the primary component is a compound containing at least one element selected from the group of Al, Ti, Zr, and Cr are described below. The layer formed on the first layer in the second layer formation step is referred to here, as in the previous sections, as the layer [C]. As described above, if the surface of the first layer is treated under specific conditions in the second layer formation step, the laminar region of the first layer in contact with the layer [C] is converted into a dense layer [B] with a high density, leading to dramatically improved gas barrier properties. It should be noted that a compound containing at least one element selected from the group of Al, Ti, Zr, and Cr as referred to for the present invention is one that is represented by a composition formula in which the composition ratio among the elements identified by a method as described below such as X-ray photoelectron spectroscopy (XPS), ICP emission spectroscopy, and Rutherford backscattering analysis consists only of integers. In the case of titanium dioxide (TiO$_2$), for instance, a substance having a composition ratio slightly differing from that based on the titanium-oxygen ratio shown in the above composition (between TiO and TiO$_2$) may result depending on the production conditions adopted, but such a compound is assumed to be TiO$_2$ in calculating the aforementioned mass content.

In this preferable embodiment, the layer [C] is preferably formed of a compound containing at least one selected from the group of oxide, nitride, and oxynitride containing at least one metal element selected from the group of Al, Ti, Zr, and Cr. From the viewpoint of flexibility and durability against bending and external, the use of a metal oxide containing at least one element selected from the group of Al, Ti, Zr, and Cr is preferred.

In regard to the composition of the metal oxide constituting the layer [C], the ratio of the number of the oxygen atoms to the number of the metal atoms is preferably 1.0 to 2.0. If the ratio of the number of the oxygen atoms to that of the metal atoms is more than 2.0, the oxygen atoms contained accounts for an excessively large proportion and accordingly, the portions occupied by voids and defects will increase, possibly making it impossible to develop required gas barrier properties. If the ratio of the number of the oxygen atoms to that of the metal atoms is less than 1.0, on the other hand, the number of the oxygen atoms will be small and accordingly, the film will have dense properties, but may be too low in flexibility. It is more preferably in the range of 1.3 to 1.8.

For the present invention, the thickness and density of the layer [C] used in the preferred embodiment can be determined by the X-ray reflectivity technique described above.

In this preferred embodiment as well, the layer [C] has a thickness in the aforementioned range.

In this preferred embodiment, the density of the layer [C] as measured by the X-ray reflectivity technique is preferably in the range of 3.5 to 5.5 g/cm$^3$. If the density of the layer [C] is less than 3.5 g/cm$^3$, the layer [C] will deteriorate in dense film properties and the portions occupied by gaps and defects will increase, possibly making it difficult to maintain required gas barrier properties. If the density of the layer [C] is more than 5.5 g/cm$^3$, the layer [C] will have excessively dense film properties, possibly leading to the generation of cracks under heat or external stress. Accordingly, the layer [C] preferably has a density of 3.5 to 5.5 g/cm$^3$, more preferably in the range of 4.0 to 5.0 g/cm$^3$.

There are no specific limitations on the method to be applied to carry out the second layer formation step, and useful layer formation methods include, for instance, vacuum deposition, sputtering, ion plating, chemical vapor deposition (abbreviated as CVD). The second layer formation step is preferably carried out under appropriate conditions, for example, by heating the polymer base film at a high temperature, using a deposition material with a low melting point, performing the deposition under reduced pressure, and activating the surface of the first layer with ions or radicals for easy surface diffusion of particles for the formation of the layer [B], so that particles can efficiently fill the defects existing in the surface laminar region of the first layer to convert it into a layer [B].

In the case where sputtering is performed, it is preferable that the plasma assisted sputtering technique be adopted to produce the second layer so that the defects existing in the surface laminar region of the first layer are efficiently filled with particles to form a layer [B]. Concretely, in addition to using plasma for sputtering of the target material, plasma of reactive gas, such as oxygen gas and carbon dioxide gas, is used to assist the processing of the surface of the first layer. In the case where ALD is performed, a preferred method is to adopt a first input gas containing at least one element selected from the group consisting of Al, Ti, Zr, and Cr and another input gas [C] that undergoes chemical reaction with the first input gas, and accelerate the conversion into a dense layer [B] by supplying the two input gases alternately and repeatedly to a polymer film in a high temperature state so that each single atom in the particles acing to form the layer [B] can diffuse in the surface of the first layer. Of these methods, the ALD technique is preferably adopted for the formed of the layer [C] to be used for the present invention, because dramatically improved gas barrier properties can be developed by allowing a monomer gas containing at least one element selected from the group consisting of Al, Ti, Zr, and Cr to be chemically adsorbed on the surface of the first layer at a high temperature and undergo a chemical reaction so that the defects in the surface of the first layer are filled efficiently at the monatomic level to form a dense metal oxide layer.

Al-containing substances useful as the first input gas for the ALD technique include, for instance, trimethyl aluminum, triethyl aluminum, trichloroaluminum, and dimethyl aluminum hydride. Useful Ti-containing substances include tetrakis(dimethylamino) titanium (TDMAT), tetrakis(diethylamino) titanium (TDEAT), and tetrakis(dialkylamino) titanium (TEMAT). Useful Zr-containing substances include zirconium tertiary butoxide (Zr(OtBu)$_4$), zirconium tetrakis, and tetra-t-butoxy zirconium. Useful Cr-containing substances include tris(acetylacetonato)chromium. Substances useful as the input gas [C] include, for instance, water-vapor-containing gas, oxygen gas, and ozone-containing gas.

[Layer of a Phase in which Zinc Oxide, Silicon Dioxide, and Aluminum Oxide Coexist.]

Described in detail below is the layer of a phase in which zinc oxide, silicon dioxide, and aluminum oxide coexist (occasionally referred to as layer [A1]), which serves favorably as the layer [A] for the present invention. Hereinafter, the phase in which zinc oxide, silicon dioxide, and aluminum oxide coexist is sometimes referred to simply as ZnO—SiO$_2$—Al$_2$O$_3$. In regard to silicon dioxide (SiO$_2$), a substance having a composition ratio slightly differing from that based on the silicon-oxygen ratio in the above composition (between SiO and SiO$_2$) may result depending on the production conditions adopted, but such a substance is herein referred to as silicon dioxide or SiO$_2$ and assumed to have a composition as expressed by the molecular formula. For zinc oxide and aluminum oxide as well, such a difference in the composition ratio from the chemical formula is treated in the same manner, and they are herein referred to as zinc oxide or ZnO, and aluminum oxide or Al$_2$O$_3$, respectively, and assumed to have compositions as expressed by the chemical formulae regardless of the differences in their composition ratios that may occur depending on the production conditions.

In the phase in which zinc oxide, silicon dioxide, and aluminum oxide coexist, the coexistence of a crystalline component contained in the zinc oxide and an amorphous component contained in the silicon dioxide acts to depress the crystal growth of the zinc oxide, which tends to form crystallites easily, leading to the formation of particles with small diameters and, in turn, a dense layer, which would depress the penetration of oxygen and water vapor. This is considered to be the reason why the existence of the layer [A1] serves to allow the gas barrier film according to the present invention to have improved gas barrier properties.

It is also inferred that the coexistence of aluminum oxide acts to further prevent the crystal growth as compared with the case of the coexistence of only zinc oxide and silicon dioxide, thereby depressing the deterioration in gas barrier properties due to the formation of cracks.

The composition of the layer [A1] can be determined by ICP emission spectroscopy analysis as described later. The Zn atom concentration determined by ICP emission spectroscopy analysis is preferably 20 to 40 atom % for the Zn atom, 5 to 20 atom % for the Si atom, 0.5 to 5 atom % for the Al atom, and 35 to 70 atom % for the O atom. If the Zn atom concentration is more than 40 atom % or if the Si atom concentration is less than 5 atom %, there will be a lack of oxides that can depress the crystal growth of zinc oxide and the portions occupied by gaps and defects will increase, possibly making it difficult to develop gas barrier properties adequately. If the Zn atom concentration is less than 20 atom % or if the Si atom concentration is more than 20 atom %, the amorphous component of silicon dioxide in the layer will account for an increased proportion, possibly leading to a layer with decreased flexibility. If the Al atom concentration is more than 5 atom %, the affinity between zinc oxide and silicon dioxide will be excessively high, possibly leading to the formation of cracks under heat or external stress. If the Al atom concentration is less than 0.5 atom %, the affinity between zinc oxide and silicon dioxide will not be sufficiently high, and accordingly, the binding force among the particles forming the layer will not be increased, possibly leading to decreased flexibility. If the O atom concentration is more than 70 atom %, the quantity of defects in the layer [A1] will increase, possibly leading to a failure to realize required gas barrier properties. If the O atom concentration is less than 35 atom %, zinc, silicon, and aluminum will not be in a sufficiently oxidized state, and accordingly, the crystal growth will not be depressed, leading to particles with large diameters and possibly resulting in deterioration in gas barrier properties. In view of these points, the atom concentration is preferably 25 to 35 atom % for the Zn atom, 10 to 15 atom % for the Si atom, 1 to 3 atom % for the Al atom, and 50 to 64 atom % for the O atom.

There are no specific limitations on the components of the layer [A1] as long as zinc oxide, silicon dioxide, and aluminum oxide are the primary components and in the composition range specified above, and the layer may contain a metal oxide containing, for instance, Al, Ti, Zr, Sn, In, Nb, Mo, Ta, and Pd. Here, the term "primary" means that the components account for 60 mass % or more, preferably 80 mass % or more, of all the components of the layer [A1].

The layer [A1] has a composition similar to that of the mixed sintered material used for producing the layer, and accordingly, the composition of the layer [A1] can be optimized by using a mixed sintered material having a composition similar to that of the intended layer.

For the composition analysis of the layer [A1], quantitative analysis of each element of zinc, silicon, and aluminum is performed by ICP emission spectroscopy, thereby determining the composition ratio of zinc oxide, silicon dioxide, aluminum oxide, and other inorganic oxides contained. Calculation for the oxygen atom is carried out on the assumption that the zinc atom, silicon atom, and aluminum atom exist in the form of zinc oxide (ZnO), silicon dioxide ($SiO_2$), and aluminum oxide ($Al_2O_3$), respectively. ICP emission spectroscopy analysis can perform simultaneous multi-element examination based on the luminescence emission spectrum observed when a specimen is introduced along with argon gas to a plasma source, and can be applied to composition analysis. If an inorganic layer or a resin layer exists on the layer [A], the surface laminar portion with a thickness determined by the X-ray reflectivity technique is removed by ion etching or chemical treatment, and the resulting specimen can be examined by ICP emission spectroscopy analysis.

There are no specific limitations on the method to be used to form a layer [A1] on a polymer base film (or on a layer disposed on a polymer base film), and an appropriate layer can be produced by vacuum deposition, sputtering, or ion plating of a mixed sintered material of zinc oxide, silicon dioxide, and aluminum oxide. In the case where separate materials of zinc oxide, silicon dioxide, and aluminum oxide are used, zinc oxide, silicon dioxide, and aluminum oxide are deposited or sputtered simultaneously from separate deposition sources or sputtering electrodes to produce a mixed film with an intended composition. Of these methods, sputtering using a mixed sintered material is preferably adopted for forming the layer [A1] for the present invention from the viewpoint of the gas barrier properties and the composition reproducibility for the layer to be formed.

[Layer of a Phase in which Zinc Sulfide and Silicon Dioxide Coexist.]

Described in detail below is the layer of a phase in which zinc sulfide and silicon dioxide coexist (occasionally referred to as layer [A2]), which serves favorably as the layer [A] for the present invention. Hereinafter, the layer of a phase in which zinc sulfide and silicon dioxide coexist is occasionally referred to ZnS—$SiO_2$. In regard to silicon dioxide ($SiO_2$), a substance having a composition ratio slightly differing from that based on the silicon-oxygen ratio in the above composition (between SiO and $SiO_2$) may result depending on the production conditions adopted, but such a substance is herein referred to as silicon dioxide or $SiO_2$ and assumed to have a composition as expressed by the molecular formula. For zinc sulfide as well, such a difference in the composition ratio from the chemical formula is treated in the same manner, and it is herein referred to as zinc sulfide or ZnS, and assumed to have a composition as expressed by the chemical formula regardless of the differences in the composition ratio that may occur depending on the production conditions.

In the phase in which zinc sulfide and silicon dioxide coexist, the coexistence of a crystalline component contained in the zinc sulfide and an amorphous component contained in the silicon dioxide acts to depress the crystal growth of the zinc sulfide, which tends to form crystallites easily, leading to the formation of particles with small diameters and, in turn, a dense layer, which would depress the penetration of oxygen and water vapor. This is considered to be the reason why the existence of the layer [A2] serves to allow the gas barrier film according to the present invention to have improved gas barrier properties. It is also considered that the coexisting zinc sulfide and silicon dioxide phase containing a zinc sulfide component with a depressed crystal growth rate is higher in flexibility than a layer composed only of an inorganic oxide or metal oxide and less liable to cracks under heat or external stress, thus allowing the layer [A2] to serve to depress the deterioration in gas barrier properties that is attributed to the formation of cracks.

In regard to the layer [A2], zinc sulfide accounts for a mole fraction of 0.7 to 0.9 of the total for zinc sulfide and silicon dioxide. If zinc sulfide accounts for a mole fraction of more than 0.9 of the total for zinc sulfide and silicon dioxide, there will be a lack of oxides that can depress the crystal growth of zinc sulfide and the portions occupied by gaps and defects will increase, possibly making it difficult to develop required gas barrier properties. If zinc sulfide accounts for a mole fraction of less than 0.7 of the total for zinc sulfide and silicon dioxide, the quantity of the amorphous component of silicon dioxide in the layer [A2] will increase and the layer will decrease in flexibility, possibly leading to a gas barrier film with decreased flexibility under mechanical bending. It is more preferably in the range of 0.75 to 0.85.

There are no specific limitations on the components of the layer [A2] as long as zinc sulfide and silicon dioxide are the primary components and in the composition range specified above, and the layer may contain a metal oxide of, for instance, Al, Ti, Zr, Sn, In, Nb, Mo, Ta, and Pd. Here, the term "primary" means that the components account for 60 mass % or more, preferably 80 mass % or more, of all the components of the layer [A2].

The layer [A2] has a composition similar to that of the mixed sintered material used for producing the layer, and accordingly, the composition of the layer [A2] can be optimized by using a mixed sintered material having a composition that meets the objective.

Composition analysis of the layer [A2] can be carried out by first determining the contents of zinc and silicon by ICP emission spectroscopy, and applying the results to quantitative analysis of each element by the Rutherford backscattering technique to determine the contents of zinc sulfide, silicon dioxide, and other inorganic oxides contained. ICP emission spectroscopy analysis can perform simultaneous multi-element examination based on the luminescence emission spectrum observed when a specimen is introduced along with argon gas to a plasma source, and can be applied to composition analysis. Furthermore, the Rutherford backscattering technique can accelerate charged particles at a high voltage, apply them to a specimen, and identify the species and determine the quantities of the elements involved from the number and energy of the charged particles rebounded from the specimen, thereby determining the content of each element. Here, since the layer [A2] is a composite layer of a sulfide and oxide, analysis is performed by the Rutherford backscattering technique which can analyze the contents of sulfur and oxygen. If another layer exists on the layer [A2], a surface laminar region having a thickness determined by the X-ray reflectivity technique is removed by ion etching or chemical treatment, and then analysis is performed by ICP emission spectroscopy analysis and the Rutherford backscattering technique.

There are no specific limitations on the method to be used to form a layer [A2] on a polymer base film (or on a layer disposed on a polymer base film), and an appropriate layer can be produced by vacuum deposition, sputtering, or ion plating of a mixed sintered material of zinc sulfide and silicon dioxide. In the case where separate materials of zinc sulfide and silicon dioxide are used, zinc sulfide and silicon dioxide are deposited or sputtered simultaneously from separate deposition sources or sputtering electrodes to produce a mixed film with an intended composition. Of these methods, sputtering using a mixed sintered material is preferably adopted for forming the layer [A2] for the present invention from the viewpoint of the gas barrier properties and the composition reproducibility for the layer to be formed.

EXAMPLES

The invention is described specifically below with reference to Examples. It should be noted that the present invention should not be construed as limited to the Examples given below.

[Evaluation Methods]

First, the evaluation methods used in Examples and Comparative examples are described. Each test procedure was carried out five times (n=5) and the measurements were averaged unless otherwise specified.

(1) Thickness and Density of Layer (1-1) Cross-Sectional Observation by TEM

Specimens for cross-sectional observation were prepared by the FIB technique using Microsampling System (FB-2000A, manufactured by Hitachi, Ltd.) (specifically, according to the procedure described in "Kobunshi Hyomen Kako" (Polymer Surface Processing)", Satoru Iwamori, pp. 118-119. A cross section of a specimen was observed by a transmission electron microscope (H-9000UHRII, manufactured by Hitachi, Ltd.) at an accelerating voltage of 300 kV to give initial values of the number and thickness of the layers determined by TEM observation.

(1-2) Fitting of Thickness and Density of Each Layer Determined by X-Ray Reflectivity Technique The thickness and density of the layer [A], layer [B], and layer [C] were measured by the X-ray reflectivity technique. Specifically, an X-ray beam was applied in oblique directions to the gas barrier layer (layer [A], layer [B], and layer [C]) disposed on a polymer base film, and the dependence of the ratio of the total reflected X-ray intensity to the incident X-ray intensity on the angle of incidence to the surface of the gas barrier layer was measured to provide the X-ray intensity profile of the resulting reflected wave. The data on the layer obtained from the cross-sectional observation in paragraph (1-1) and its density calculated using the composition information obtained from the evaluations made in sections (3) to (5) were used as initial values to perform fitting of the X-ray intensity profile by the procedure described herein, thereby determining the thickness and density in various regions.

The measuring conditions used were as described below.
Equipment: Rigaku SmartLab
Analysis software: Rigaku Grobal Fit ver. 1.3.2
Measuring range (angle from specimen surface): 0 to 8.0°, at 0.01° intervals
Entrance slit size: 0.05 mm×10.0 mm
Receiving slit size: 0.15 mm×20.0 mm (2) Water Vapor Permeability Measurements were made by using a water vapor transmission rate measuring machine (model: Deltaperm (registered trademark)) manufactured by Technolox, U.K., under the conditions of a temperature of 40° C., humidity of 90% RH, and measuring area of 50 cm$^2$ Two specimens were sampled at a level, and ten measurements were made for each specimen and averaged to provide a value to represent its water vapor transmission rate.

(3) Composition of Layer [A1]

ICP emission spectroscopy analysis (SPS4000, manufactured by SII NanoTechnology Inc.) was performed. The contents of the zinc atom, silicon atom, and aluminum atom in a specimen were measured, and converted to the ratio in the number of atoms. Calculation for the oxygen atom was carried out on the assumption that the zinc atom, silicon atom, and aluminum atom exist in the form of zinc oxide (ZnO), silicon dioxide ($SiO_2$), and aluminum oxide ($Al_2O_3$), respectively.

(4) Composition of Layer [A2]

ICP emission spectroscopy analysis (SPS4000, manufactured by SII NanoTechnology Inc.) was performed, and the results were analyzed by the Rutherford backscattering technique (AN-2500, manufactured by Nissin High Voltage Co., Ltd.) for quantitative analysis of each element to determine the contents of zinc sulfide and silicon dioxide.

(5) Composition of Layer [B] and Layer [C]

X-ray photoelectron spectroscopy (XPS) was performed to determine the ratio of the number of metal atoms or nonmetal atoms contained to the number of oxygen atoms, and the characteristics described in sections (3) and (4) were also measured as required. The measuring conditions used were as described below.

Equipment: Quantera SXM (manufactured by PHI)
Excited X-ray: monochromatic Al Kα1, 2
X-ray diameter: 100 μm
Photoelectron take-off angle: 10°

[Method for Forming Layers in Examples 1 to 7]

(Formation of Layer [A1])

Figure 2A:
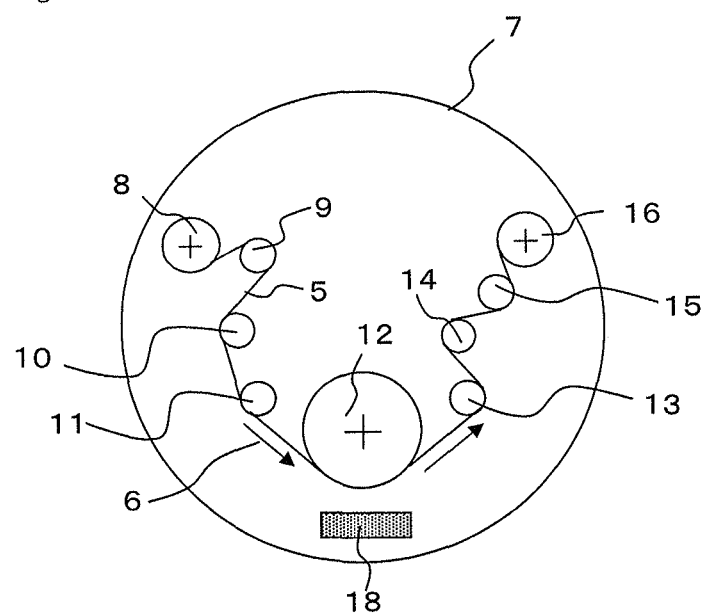
FIG. 2A is a schematic diagram of a wind-up type sputtering apparatus designed for the production of the gas barrier film according to an embodiment of the present invention.

A wind-up type sputtering apparatus having a structure as illustrating FIG. 2A was used. A sputtering target, that is, a mixed sintered material formed of zinc oxide, silicon dioxide, and aluminum oxide, was installed on a sputtering electrode 18 and sputtered on the surface of a polymer base film 5 using argon gas and oxygen gas to produce a layer [A1].

Concrete operations are described below. First, in a wind-up chamber 7 of a wind-up type sputtering apparatus containing a sputtering electrode 18 carrying a sputtering target composed of zinc oxide, silicon dioxide, and aluminum oxide sintered at a mass composition ratio of 77:20:3, the polymer base film 5 was set on an unwinding roll 8 in such a manner that the surface to be provided with a layer [A1] faced the sputtering electrode 18 and that the film was allowed to travel on the unwinding roll and guide rolls 9, 10, and 11 before reaching a cooling drum 12. Argon gas and oxygen gas, with an oxygen gas partial pressure of 10%, were introduced so that the degree of vacuum would be $2 \times 10^{-1}$ Pa, and a power of 4,000 W was applied by a direct current power source to generate argon-oxygen gas plasma, thereby producing a layer [A1] by sputtering on the surface of the polymer base film 5. The thickness was adjusted by controlling the film conveyance speed. Subsequently, the film was wound up on the wind-up roll 16 after travelling on the guide rolls 13, 14, and 15.

(Formation of Layer [A2])

A wind-up type sputtering apparatus having a structure as illustrating FIG. 2A was used. A sputtering target, that is, a mixed sintered material formed of zinc sulfide and silicon dioxide was installed on a sputtering electrode 18 and sputtered on the surface of a polymer base film 5 using argon gas plasma to produce a layer [A2].

Concrete operations are described below. First, in a wind-up chamber 7 of a wind-up type sputtering apparatus containing a sputtering electrode 18 carrying a sputtering target composed of zinc sulfide and silicon dioxide sintered at a molar composition ratio of 80:20, the polymer base film 5 was set on an unwinding roll 8 in such a manner that the film would travel on unwinding roll and guide rolls 9, 10, and 11 before reaching a cooling drum 12. Argon gas was introduced so that the degree of vacuum would be $2\times10^{-1}$ Pa, and a power of 500 W was applied by a high frequency power source to generate argon gas plasma, thereby producing a layer [A2] by sputtering on the surface of the polymer base film 5. The thickness was adjusted by controlling the film conveyance speed. Subsequently, the film was wound up on the wind-up roll 16 after travelling on the guide rolls 13, 14, and 15.
(Formation of Layer [B])

A wind-up type sputtering apparatus having a structure as illustrated in FIG. 2A was used. A sputtering target formed of tin oxide was installed on the sputtering electrode 18 and sputtering was carried out using argon gas plasma to form a layer [B] on the surface of the polymer base film 5 (the surface where the layer [A1] or the layer [A2] has been formed).

Concrete operations are described below. First, in a wind-up chamber 7 of a wind-up type sputtering apparatus containing a sputtering electrode 18 carrying a sputtering target composed of sintered tin oxide, the polymer base film 5 was set on an unwinding roll 8 in such a manner that the film would travel on unwinding roll and guide rolls 9, 10, and 11 before reaching a cooling drum 12. Argon gas was introduced so that the degree of vacuum would be $2\times10^{-1}$ Pa, and a power of 500 W was applied by a high frequency power source to generate argon gas plasma, thereby producing a layer [B] by sputtering on the surface of the polymer base film 5. The thickness was adjusted by controlling the film conveyance speed. Subsequently, the film was wound up on the wind-up roll 16 after travelling on the guide rolls 13, 14, and 15.
(Formation of Layer [C])

A wind-up type sputtering apparatus having a structure as illustrated in FIG. 2A was used. A sputtering target formed of aluminum oxide was installed on the sputtering electrode 18 and sputtering was carried out using argon gas plasma to form a layer [C] on the surface of the polymer base film 5 (the surface where the layer [B] has been formed).

Concrete operations are described below. First, in a wind-up chamber 7 of a wind-up type sputtering apparatus containing a sputtering electrode 18 carrying a sputtering target composed of sintered aluminum oxide, the polymer base film 5 was set on an unwinding roll 8 in such a manner that the film would travel on unwinding roll and guide rolls 9, 10, and 11 before reaching a cooling drum 12. Argon gas was introduced so that the degree of vacuum would be $2\times10^{-1}$ Pa, and a power of 500 W was applied by a high frequency power source to generate argon gas plasma, thereby producing a layer [C] by sputtering on the surface of the polymer base film 5. The thickness was adjusted by controlling the film conveyance speed. Subsequently, the film was wound up on the wind-up roll 16 after travelling on the guide rolls 13, 14, and 15.

Example 1

A polymer base film 5 with a thickness of 188 μm (Lumirror (registered trademark) U35, manufactured by Toray Industries, Inc., adhesive layer provided on one side, and polyethylene terephthalate exposed on the other) was used as the polymer base film. A layer [A1] intended to have a thickness of 100 nm was formed on the surface of the polymer base film where polyethylene terephthalate was exposed.

Subsequently, the layer [B], intended to have a thickness of 3 nm, was formed on the layer [A1], and furthermore, the layer [B], intended to have a thickness of 100 nm, was formed on the layer [C] to produce a gas barrier film. In regard to the composition of the layer [A1], the atom concentration was 27.5 atom % for the Zn atom, 13.1 atom % for the Si atom, 2.3 atom % for the Al atom, and 57.1 atom % for the O atom. In regard to the composition of the layer [B], the ratio of the number of oxygen atoms to the number of tin atoms was 1.9. In regard to the composition of the layer [C], the ratio of the number of oxygen atoms to the number of aluminum atoms was 1.4.

Subsequently, test pieces with a length of 100 mm and width of 140 mm were cut out of the resulting gas barrier film, and the thickness, density, and water vapor transmission rate of each layer were evaluated by the X-ray reflectivity technique. Results are given in Table 1.

Example 2

Except for forming a layer [A2] instead of the layer [A1], the same procedure as in Example 1 was carried out to provide a gas barrier film. In regard to the composition of the layer [A2], the mole fraction of zinc sulfide was 0.85.

Example 3

Except that the intended thickness the layer [B] was 17 nm instead of 3 nm, the same procedure as in Example 1 was carried out to provide a gas barrier film.

Example 4

Zirconium oxide was used as sputtering target instead of tin oxide to form a layer [B] with an intended thickness of 5 nm, and in addition, silicon oxide was used as sputtering target instead of aluminum oxide to form a layer [C] with an intended thickness of 100 nm. Except for this, the same procedure as in Example 1 was carried out to produce a gas barrier film. In regard to the composition of the layer [B], the ratio of the number of oxygen atoms to the number of zirconium atoms was 1.8. In regard to the composition of the layer [C], the ratio of the number of oxygen atoms to the number of silicon atoms was 1.6.

Example 5

Tin oxide was used as sputtering target to form a layer [A] with an intended thickness of 100 nm, and in addition, hafnium oxide was used as sputtering target instead of tin oxide to form a layer [B] with an intended thickness of 5 nm. Except for this, the same procedure as in Example 2 was carried out to produce a gas barrier film. In regard to the composition of the layer [A], the ratio of the number of oxygen atoms to the number of tin atoms was 1.9. In regard to the composition of the layer [B], the ratio of the number of oxygen atoms to the number of hafnium atoms was 1.9.

Example 6

Tantalum pentoxide was used as sputtering target to form a layer [A] with an intended thickness of 100 nm, and in addition, hafnium oxide was used as sputtering target instead of tin oxide to form a layer [B] with an intended thickness of 5 nm. Except for this, the same procedure as in Example 2 was carried out to produce a gas barrier film. In regard to the composition of the layer [A], the ratio of the number of oxygen atoms to the number of tantalum atoms was 2.5. In regard to the composition of the layer [B], the ratio of the number of oxygen atoms to the number of hafnium atoms was 1.9.

Example 7

Hafnium oxide was used as layer [B] sputtering target instead of tin oxide to form a layer [B] with an intended thickness of 5 nm, and in addition, tantalum pentoxide was used as layer [C] sputtering target instead of aluminum oxide to form a layer [C] with an intended thickness of 100 nm. Except for this, the same procedure as in Example 1 was carried out to produce a gas barrier film. In regard to the composition of the layer [B], the ratio of the number of oxygen atoms to the number of hafnium atoms was 1.9. In regard to the composition of the layer [C], the ratio of the number of oxygen atoms to the number of tantalum atoms was 2.5.

Comparative Example 1

Except for omitting the formation of a layer [B], the same procedure as in Example 1 was carried out to provide a gas barrier film.

Comparative Example 2

Except for forming a layer [A2] instead of the layer [A1] and omitting the formation of a layer [B], the same procedure as in Example 1 was carried out to provide a gas barrier film.

Comparative Example 3

Aluminum oxide was used as sputtering target instead of tin oxide to form a layer [B] with an intended thickness of 5 nm, and in addition, tin oxide was used as sputtering target instead of aluminum oxide to form a layer [[C] with an intended thickness of 100 nm. Except for this, the same procedure as in Example 1 was carried out to produce a gas barrier film. In regard to the composition of the layer [B], the ratio of the number of oxygen atoms to the number of aluminum atoms was 1.35. In regard to the composition of the layer [C], the ratio of the number of oxygen atoms to the number of tin atoms was 1.8.

Comparative Example 4

A layer [A2] was first formed instead of the layer [A1]. Then, aluminum oxide was used as layer [B] sputtering target instead of tin oxide to form a layer [B] with an intended thickness of 5 nm, and in addition, tin oxide was used as sputtering target instead of aluminum oxide to form a layer [C] with an intended thickness of 100 nm. Except for this, the same procedure as in Example 1 was carried out to produce a gas barrier film. In regard to the composition of the layer [B], the ratio of the number of oxygen atoms to the number of aluminum atoms was 1.35. In regard to the composition of the layer [C], the ratio of the number of oxygen atoms to the number of tin atoms was 1.8.

Comparative Example 5

Except for forming a layer [B] with an intended thickness of 35 nm instead of 3 nm, the same procedure as in Example 1 was carried out to provide a gas barrier film.

Comparative Example 6

Except for forming a layer [A2] instead of the layer [A1] and forming a layer [B] with an intended thickness of 35 nm instead of 3 nm, the same procedure as in Example 1 was carried out to provide a gas barrier film.

TABLE 1

| | layer [A] | | layer [B] | | layer [C] | | |
|---|---|---|---|---|---|---|---|
| | density (g/cm$^3$) | thickness (nm) | density (g/cm$^3$) | thickness (nm) | density (g/cm$^3$) | thickness (nm) | water vapor transmission rate (g/(m$^2$ · 24 hr · atm)) |
| Example 1 | 4.3 | 100.8 | 6.8 | 2.7 | 3.5 | 98.4 | $9.4 \times 10^{-4}$ |
| Example 2 | 4.0 | 100.2 | 6.5 | 3.2 | 3.6 | 106.4 | $7.4 \times 10^{-4}$ |
| Example 3 | 4.1 | 94.4 | 6.3 | 17.9 | 3.8 | 100.8 | $2.2 \times 10^{-4}$ |
| Example 4 | 4.0 | 81.1 | 4.7 | 4.4 | 2.3 | 100.4 | $5.5 \times 10^{-4}$ |
| Example 5 | 6.6 | 100.1 | 9.2 | 6.2 | 3.8 | 101.5 | $3.1 \times 10^{-4}$ |
| Example 6 | 8.2 | 104.6 | 9.2 | 5.9 | 3.7 | 99.8 | $3.7 \times 10^{-4}$ |
| Example 7 | 4.3 | 100.1 | 9.2 | 6.4 | 8.2 | 104.6 | $4.4 \times 10^{-4}$ |
| Comparative example 1 | 4.4 | 105.2 | — | — | 3.4 | 100.5 | $7.8 \times 10^{-3}$ |
| Comparative example 2 | 4.0 | 106.2 | — | — | 3.4 | 99.3 | $9.2 \times 10^{-3}$ |
| Comparative example 3 | 4.3 | 98.4 | 3.2 | 3.1 | 6.4 | 101.1 | $5.4 \times 10^{-3}$ |
| Comparative example 4 | 4.0 | 98.5 | 3.1 | 3.4 | 6.4 | 99.2 | $4.2 \times 10^{-3}$ |
| Comparative example 5 | 4.4 | 83.3 | 6.6 | 35.2 | 3.2 | 100.3 | $9.7 \times 10^{-3}$ |
| Comparative example 6 | 3.9 | 88.7 | 6.3 | 35.7 | 3.4 | 98.2 | $1.2 \times 10^{-2}$ |

[Method for Forming Layers in Examples 11 to 14]
(Formation of the First Layer)
Formation of a First Layer in which the Layer [A] is a Layer [A1] (Hereinafter Referred to as First Layer-1)

A wind-up type sputtering and chemical vapor deposition apparatus (hereinafter referred to as sputtering and CVD apparatus) having a structure as illustrating FIG. 2B was used. A sputtering target, that is, a mixed sintered material formed of zinc oxide, silicon dioxide, and aluminum oxide, was installed in a sputtering electrode 18 and sputtered on the surface of a polymer base film 5 using argon gas and oxygen to produce a first layer-1.

Concrete operations are described below. First, in a wind-up chamber 7 of the sputtering and CVD apparatus containing a sputtering electrode 18 carrying a sputtering target composed of zinc oxide, silicon dioxide, and aluminum oxide sintered at a mass composition ratio of 77:20:3, the polymer base film 5 was set on an unwinding roll 8 in such a manner that the surface to be provided with a first layer-1 faced the sputtering electrode 18 and that the film was allowed to travel on the unwinding roll and guide rolls 9, 10, and 11 before reaching a cooling drum 12. Argon gas and oxygen gas, with an oxygen gas partial pressure of 10%, were introduced so that the degree of vacuum would be $2\times10^{-1}$ Pa, and a power of 4,000 W was applied by a direct current power source to generate argon-oxygen gas plasma, thereby producing a first layer-1 by sputtering on the surface of the polymer base film 5. The thickness was adjusted by controlling the film conveyance speed. Subsequently, the film was wound up on the wind-up roll 16 after travelling on the guide rolls 13, 14, and 15.

Formation of a First Layer in which the Layer [A] is a Layer [A2] (Hereinafter Referred to as First Layer-2)

Figure 2B:
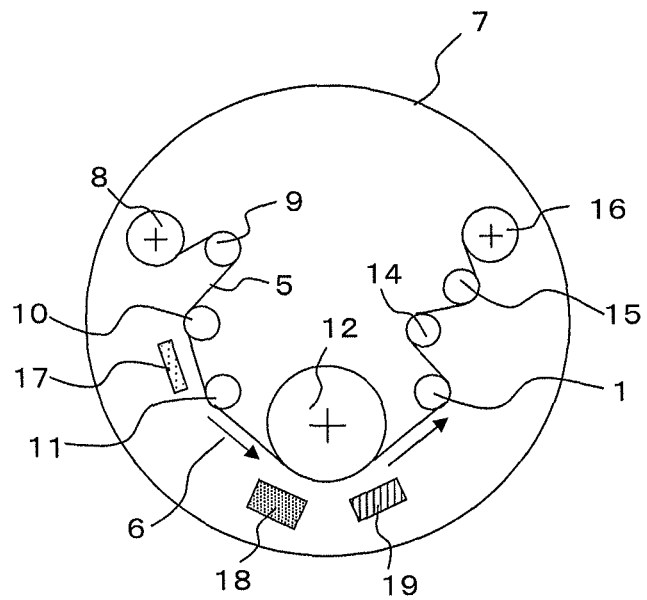
FIG. 2B is a schematic diagram of a wind-up type sputtering and chemical vapor deposition apparatus (sputtering and CVD apparatus) designed for the production of the gas barrier film according to an embodiment of the present invention.

A sputtering and CVD apparatus having a structure as illustrating FIG. 2B was used. A sputtering target, that is, a mixed sintered material formed of zinc sulfide and silicon dioxide was installed on a sputtering electrode 18 and sputtered on the surface of a polymer base film 5 using argon gas plasma to produce a first layer-2.

Concrete operations are described below. First, in a wind-up chamber 7 of the sputtering and CVD apparatus containing a sputtering electrode 18 carrying a sputtering target composed of zinc sulfide and silicon dioxide sintered at a molar composition ratio of 80:20, the polymer base film 5 was set on an unwinding roll 8 in such a manner that the film would travel on unwinding roll and guide rolls 9, 10, and 11 before reaching a cooling drum 12. Argon gas was introduced so that the degree of vacuum would be $2\times10^{-1}$ Pa, and a power of 500 W was applied by a high frequency power source to generate argon gas plasma, thereby producing a first layer-2 by sputtering on the surface of the polymer base film 5. The thickness was adjusted by controlling the film conveyance speed. Subsequently, the film was wound up on the wind-up roll 16 after travelling on the guide rolls 13, 14, and 15.

(Formation of the Second Layer)

A sputtering and CVD apparatus having a structure as illustrating FIG. 2B was used. Chemical vapor deposition of hexamethyl disiloxane, used as input material, was carried out to form a second layer on the surface of the polymer base film 5 (the surface where the first layer-1 or the first layer-2 has been formed).

Concrete operations are described below. In the wind-up chamber 7 of a sputter and CVD apparatus, the polymer base film 5 was set on an unwinding roll 8 in such a manner that the film would travel on unwinding roll and guide rolls 9, 10, and 11 before reaching a cooling drum 12. Oxygen gas and hexamethyl disiloxane were introduced at 0.5 L/min and 70 cc/min, respectively, so that the degree of vacuum would be $2\times10^{-1}$ Pa, and an electric power of 3,000 W was applied to a CVD electrode 19 by a high frequency power source to generate plasma, thereby forming a second layer by CVD on the surface of a polymer base film 5. Subsequently, the film was wound up on a wind-up roll 16 after travelling on guide rolls 13, 14, and 15.

Example 11

A polymer base film 5 with a thickness of 188 µm (Lumirror (registered trademark) U35, manufactured by Toray Industries, Inc., adhesive layer provided on one side, and polyethylene terephthalate exposed on the other) was used as the polymer base film. A first layer-1 intended to have a thickness of 100 nm was formed on the surface of the polymer base film where polyethylene terephthalate was exposed.

Then a second layer intended to have a thickness of 100 nm was formed on the first layer-1 to provide a gas barrier film. It was confirmed that in the resulting gas barrier film, a laminar region of the first layer-1 facing the second layer had been converted into a layer [B] and a gas barrier layer composed of a layer [A], layer [B], and layer [C] had been formed. The layer [A] was found to be a layer [A1], and in regard to its composition, the atom concentration was 27.5 atom % for the Zn atom, 13.1 atom % for the Si atom, 2.3 atom % for the Al atom, and 57.1 atom % for the O atom. In regard to the composition of the layer [C], the ratio of the number of oxygen atoms to the number of silicon atoms was 1.7.

Subsequently, test pieces with a length of 100 mm and width of 140 mm were cut out of the resulting gas barrier film, and the thickness, density, and water vapor transmission rate of each layer were evaluated by the X-ray reflectivity technique. Results are given in Table 2. Here, the thickness values obtained from cross-sectional photographs taken by transmission electron microscopic observation were used as initial values for analysis by the X-ray reflectivity technique, while the density value calculated from composition analysis of the through-thickness central region of each layer was used as initial value.

Example 12

Except for forming a first layer-2 instead of the first layer-1, the same procedure as in Example 11 was carried out to provide a gas barrier film.

The layer [A] was found to be a layer [A2], and in regard to its composition, the mole fraction of zinc sulfide was 0.85.

Example 13

Except that the second layer was formed by applying an increased electric power of 5,000 W from a high frequency power source, the same procedure as in Example 11 was carried out to provide a gas barrier film. In regard to the composition of the layer [C], the ratio of the number of oxygen atoms to the number of silicon atoms was 1.9.

Example 14

Except for forming a first layer-2 instead of the first layer-1 and forming a second layer by applying an increased electric power of 5,000 W from a high frequency power source, the same procedure as in Example 11 was carried out to provide a gas barrier film. In regard to the composition of the layer [C], the ratio of the number of oxygen atoms to the number of silicon atoms was 1.9.

Comparative Example 11

Except that the second layer was formed by applying a decreased electric power of 500 W from a high frequency power source, the same procedure as in Example 11 was carried out to provide a gas barrier film. In regard to the composition of the layer [C], the ratio of the number of oxygen atoms to the number of silicon atoms was 1.5.

Comparative Example 12

Except for forming a first layer-2 instead of the first layer-1 and forming a second layer by applying a decreased electric power of 500 W from a high frequency power source, the same procedure as in Example 11 was carried out to provide a gas barrier film. In regard to the composition of the layer [C], the ratio of the number of oxygen atoms to the number of silicon atoms was 1.5.

Comparative Example 13

Before the formation of the second layer, oxygen gas was introduced at 0.5 L/min to an electrode 17 designed for surface treatment and an electric power of 2,000 W was applied from a direct current power source to generate oxygen gas plasma for surface etching of the first layer-1, and then a second layer was formed on the etched surface of the first layer-1 by applying a decreased electric power of 500 W from the high frequency power source. Except for this, the same procedure as in Example 11 was carried out to provide a gas barrier film. In regard to the composition of the layer [C], the ratio of the number of oxygen atoms to the number of silicon atoms was 1.4.

Comparative Example 14

A first layer-2 was formed instead of the first layer-1. Subsequently, before the formation of the second layer, oxygen gas was introduced at 0.5 L/min to an electrode 17 designed for surface treatment and an electric power of 2,000 W was applied from a direct current power source to generate oxygen gas plasma for surface etching of the first layer-1. Then, a second layer was formed on the etched surface of the first layer-2 by applying a decreased electric power of 500 W from the high frequency power source. Except for these changes, the same procedure as in Example 11 was carried out to provide a gas barrier film. In regard to the composition of the layer [C], the ratio of the number of oxygen atoms to the number of silicon atoms was 1.4.

Comparative Example 15

Except for forming the second layer by applying an increased electric power of 5,000 W from a high frequency power source and decreasing the polymer film conveyance speed to lengthen the layer formation time, the same procedure as in Example 1 was carried out to provide a gas barrier film. In regard to the composition of the layer [C], the ratio of the number of oxygen atoms to the number of silicon atoms was 1.9.

Comparative Example 16

Except for forming a first layer-2 instead of the first layer-1, forming a second layer by applying an increased electric power of 5,000 W from a high frequency power source, and decreasing the polymer film conveyance speed to lengthen the layer formation time, the same procedure as in Example 11 was carried out to provide a gas barrier film. In regard to the composition of the layer [C], the ratio of the number of oxygen atoms to the number of silicon atoms was 1.9.

TABLE 2

| | the layer originating from the first layer formation step | | | | | | |
|---|---|---|---|---|---|---|---|
| | layer [A] | | layer [B] | | layer [C] | | |
| | density (g/cm$^3$) | thickness (nm) | density (g/cm$^3$) | thickness (nm) | density (g/cm$^3$) | thickness (nm) | water vapor transmission rate (g/(m$^2$ · 24 hr · atm)) |
| Example 11 | 4.5 | 84.1 | 4.7 | 2.1 | 2.3 | 110.0 | $8.5 \times 10^{-4}$ |
| Example 12 | 3.9 | 100.2 | 4.8 | 3.2 | 2.4 | 111.2 | $6.5 \times 10^{-4}$ |
| Example 13 | 4.1 | 92.7 | 4.7 | 18.2 | 2.3 | 98.9 | $2.5 \times 10^{-4}$ |
| Example 14 | 4.0 | 81.1 | 4.6 | 17.2 | 2.3 | 100.4 | $3.2 \times 10^{-4}$ |
| Comparative example 11 | 4.4 | 100.2 | — | — | 2.1 | 97.9 | $5.4 \times 10^{-3}$ |
| Comparative example 12 | 3.8 | 97.3 | — | — | 2.1 | 100.4 | $4.3 \times 10^{-3}$ |
| Comparative example 13 | 4.3 | 98.4 | 4.1 | 3.2 | 2.4 | 100.7 | $7.4 \times 10^{-3}$ |
| Comparative example 14 | 4.0 | 98.5 | 3.8 | 3.4 | 2.1 | 99.2 | $9.2 \times 10^{-3}$ |
| Comparative example 15 | 4.4 | 83.3 | 4.7 | 23.5 | 2.5 | 80.3 | $9.7 \times 10^{-3}$ |
| Comparative example 16 | 3.9 | 88.7 | 4.7 | 22.7 | 2.6 | 85.2 | $1.2 \times 10^{-2}$ |

[Method for Forming Layers in Examples 21 to 26]
(Formation of the First Layer)
Formation of a First Layer in which the Layer [A] is a Layer [A1] (Hereinafter Referred to as First Layer-1)

A wind-up type sputtering and atomic layer deposition apparatus (hereinafter referred to as sputtering and ALD apparatus) having a structure as illustrating FIG. 2C was used. A sputtering target, that is, a mixed sintered material formed of zinc oxide, silicon dioxide, and aluminum oxide, was installed in a sputtering electrode 18 and sputtered on the surface of a polymer base film 5 using argon gas and oxygen to produce a first layer-1.

Concrete operations are described below. First, in a wind-up chamber 7 of the sputtering and ALD apparatus containing a sputtering electrode 18 carrying a sputtering target composed of zinc oxide, silicon dioxide, and aluminum oxide sintered at a mass composition ratio of 77:20:3, the polymer base film 5 was set on an unwinding roll 8 in such a manner that the surface to be provided with a first layer-1 faced the sputtering electrode 18 and that the film was allowed to travel on the unwinding roll and guide rolls 9, 10, and 11 before reaching a main roll 12 adjusted at 15° C. using tap water. Argon gas and oxygen gas, with an oxygen gas partial pressure of 10%, were introduced so that the degree of vacuum would be $2\times10^{-1}$ Pa in a sputtering chamber 22, and a power of 4,000 W was applied by a direct current power source to generate argon-oxygen gas plasma, thereby producing a first layer-1 by sputtering on the surface of the polymer base film 5. The thickness was adjusted by controlling the film conveyance speed. Subsequently, the film was wound up on a wind-up roll 16 after travelling on guide rolls 13, 14, and 15.

Formation of a First Layer in which the Layer [A] is a Layer [A2] (Hereinafter Referred to as First Layer-2)

Figure 2C:
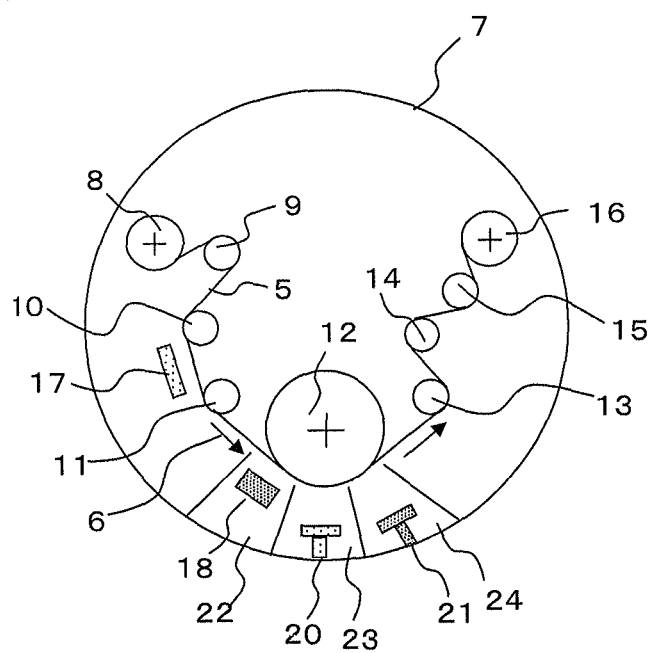
FIG. 2C is a schematic diagram of a wind-up type sputtering and atomic layer deposition apparatus (sputter-ALD equipment) designed for the production of the gas barrier film according to an embodiment of the present invention.

A sputtering and ALD apparatus having a structure as illustrating FIG. 2C was used. A sputtering target, that is, a mixed sintered material formed of zinc sulfide and silicon dioxide was installed on a sputtering electrode 18 and sputtered on the surface of a polymer base film 5 using argon gas plasma to produce a first layer-2.

Concrete operations are described below. First, in a wind-up chamber 7 of a sputtering and ALD apparatus containing a sputtering electrode 18 carrying a sputtering target composed of zinc sulfide and silicon dioxide sintered at a molar composition ratio of 80:20, the polymer base film 5 was set on an unwinding roll 8 in such a manner that the film would travel on the unwinding roll and guide rolls 9, 10, and 11 before reaching a main drum 12 adjusted at 15° C. using tap water. Argon gas was introduced so that the degree of vacuum would be $2\times10^{-1}$ Pa in a sputtering chamber 22, and a power of 500 W was applied by a high frequency power source to generate argon gas plasma, thereby producing a first layer-2 by sputtering on the surface of the polymer base film 5. The thickness was adjusted by controlling the film conveyance speed. Subsequently, the film was wound up on a wind-up roll 16 after travelling on guide rolls 13, 14, and 15.

(Formation of the Second Layer)

A sputtering and ALD apparatus having a structure as illustrating FIG. 2C was used. Atomic layer deposition was carried out to form a second layer of aluminum oxide on the surface of the polymer base film 5 (the surface where the first layer-1 or the first layer-2 has been formed).

Concrete operations are described below. In the wind-up chamber 7 of a sputter and ALD apparatus, the polymer base film 5 was set on an unwinding roll 8 in such a manner that the film would travel on unwinding roll and guide rolls 9, 10, and 11 before reaching a main drum 12 adjusted to 90° C. using a heating medium. Trimethyl aluminum gas was introduced so that the degree of vacuum would be 50 Pa in the first input gas supply chamber 23 while water vapor was introduced so that the degree of vacuum would be 50 Pa in the second input gas supply chamber 24, the polymer base film 5 was fed first through the first input gas supply chamber 23 and then through the second input gas supply chamber 24 to form a second layer on the surface of the polymer base film 5. Subsequently, the film was wound up on a wind-up roll 16 after travelling on guide rolls 13, 14, and 15.

Example 21

A polymer base film 5 with a thickness of 188 μm (Lumirror (registered trademark) U35, manufactured by Toray Industries, Inc., adhesive layer provided on one side, and polyethylene terephthalate exposed on the other) was used as the polymer base film. A first layer-1 intended to have a thickness of 100 nm was formed on the surface of the polymer base film where polyethylene terephthalate was exposed.

A second layer intended to have a thickness of 50 nm was formed on the first layer-1 to provide a gas barrier film. The thickness was adjusted by carrying out the film formation step in the first input gas supply chamber 23 and second input gas supply chamber 24 repeatedly. It was confirmed that in the resulting gas barrier film, a laminar region of the first layer-1 facing the second layer had been converted into a layer [B] and a gas barrier layer composed of a layer [A], layer [B], and layer [C] had been formed. The layer [A] was found to be a layer [A1], and in regard to its composition, the atom concentration was 27.5 atom % for the Zn atom, 13.1 atom % for the Si atom, 2.3 atom % for the Al atom, and 57.1 atom % for the O atom. In regard to the composition of the layer [C], the ratio of the number of oxygen atoms to the number of aluminum atoms was 1.3.

Test pieces with a length of 100 mm and width of 140 mm were cut out of the resulting gas barrier film, and the thickness, density, and water vapor transmission rate of each layer were evaluated by the X-ray reflectivity technique. Results are given in Table 3. Here, the thickness values obtained from cross-sectional photographs taken by transmission electron microscopic observation were used as initial values for analysis by the X-ray reflectivity technique, while the density calculated from composition analysis of the through-thickness central region of each layer was used as initial density value.

Example 22

Except for forming a first layer-2 as described below instead of the first layer-1, the same procedure as in Example 21 was carried out to provide a gas barrier film. The layer [A] was found to be a layer [A2], and in regard to its composition, the mole fraction of zinc sulfide was 0.85.

Example 23

Except that the temperature of the main drum 12 used for the formation of the second layer was increased to 150° C., the same procedure as in Example 21 was carried out to provide a gas barrier film. In regard to the composition of the layer [C], the ratio of the number of oxygen atoms to the number of aluminum atoms was 1.4.

Example 24

Except that zirconium tertiary butoxide gas was used as the first input gas for the formation of the second layer and that the temperature of the main drum 12 used for the formation was increased to 120° C., the same procedure as in Example 21 was carried out to provide a gas barrier film. In regard to the composition of the layer [C], the ratio of the number of oxygen atoms to the number of zirconium atoms was 1.8.

Example 25

Except that tetrakis(dialkylamino)titanium gas was used as the first input gas for the formation of the second layer and that the temperature of the main drum 12 used for the formation was increased to 120° C., the same procedure as in Example 21 was carried out to provide a gas barrier film. In regard to the composition of the layer [C], the ratio of the number of oxygen atoms to the number of titanium atoms was 2.0.

Example 26

Except that tris(acetylacetonato)chromium gas was used as the first input gas for the formation of the second layer and that the temperature of the main drum 12 used for the formation was increased to 120° C., the same procedure as in Example 21 was carried out to provide a gas barrier film. In regard to the composition of the layer [C], the ratio of the number of oxygen atoms to the number of chromium atoms was 1.5.

Comparative Example 21

Except that the temperature of the main drum 12 used for the formation of the second layer was decreased to 30° C., the same procedure as in Example 21 was carried out to provide a gas barrier film. In regard to the composition of the layer [C], the ratio of the number of oxygen atoms to the number of aluminum atoms was 1.6.

Comparative Example 22

Except for forming a first layer-2 instead of the first layer-1 and forming a second layer using a main drum 12 with a decreased temperature of 30° C., the same procedure as in Example 21 was carried out to provide a gas barrier film. In regard to the composition of the layer [C], the ratio of the number of oxygen atoms to the number of aluminum atoms was 1.7.

Comparative Example 23

Except for forming the second layer using a main drum 12 with an increased temperature of 150° C. and decreasing the polymer film conveyance speed to lengthen the layer formation time, the same procedure as in Example 21 was carried out to provide a gas barrier film. In regard to the composition of the layer [C], the ratio of the number of oxygen atoms to the number of aluminum atoms was 1.4.

Comparative Example 24

Before the formation of the second layer, oxygen gas was introduced at 0.5 L/min to an electrode 17 for surface treatment and an electric power of 2,000 W was applied from a direct current power source to generate oxygen gas plasma for surface etching of the first layer-1, and then a second layer was formed on the etched surface of the first layer-1 using a main drum 12 with a decreased temperature of 20° C. Except for this, the same procedure as in Example 21 was carried out to provide a gas barrier film. In regard to the composition of the layer [C], the ratio of the number of oxygen atoms to the number of aluminum atoms was 1.1.

Comparative Example 25

Except for forming the second layer using zirconium tertiary butoxide gas as the first input gas, using a main drum 12 with an increased temperature of 120° C., and decreasing the polymer film conveyance speed to lengthen the layer formation time, the same procedure as in Example 21 was carried out to provide a gas barrier film. In regard to the composition of the layer [C], the ratio of the number of oxygen atoms to the number of zirconium atoms was 1.9.

Comparative Example 26

Except for forming the second layer using tetrakis(dialkylamino)titanium gas as the first input gas, using a main drum 12 with an increased temperature of 120° C., and decreasing the polymer film conveyance speed to lengthen the layer formation time, the same procedure as in Example 21 was carried out to provide a gas barrier film. In regard to the composition of the layer [C], the ratio of the number of oxygen atoms to the number of titanium atoms was 2.4.

Comparative Example 27

Except for forming the second layer using tris(acetylacetonato)chromium gas as the first input gas, using a main drum 12 with an increased temperature of 120° C., and decreasing the polymer film conveyance time to lengthen the layer formation time, the same procedure as in Example 1 was carried out to provide a gas barrier film. In regard to the composition of the layer [C], the ratio of the number of oxygen atoms to the number of chromium atoms was 1.8.

TABLE 3

| | the layer originating from the first layer formation step | | | | | | |
|---|---|---|---|---|---|---|---|
| | layer [A] | | layer [B] | | layer [C] | | |
| | density (g/cm$^3$) | thickness (nm) | density (g/cm$^3$) | thickness (nm) | density (g/cm$^3$) | thickness (nm) | water vapor transmission rate (g/(m$^2$ · 24 hr · atm)) |
| Example 21 | 4.0 | 99.1 | 4.2 | 3.4 | 3.9 | 44.4 | $7.4 \times 10^{-4}$ |
| Example 22 | 4.0 | 96.7 | 4.3 | 3.2 | 4.1 | 47.5 | $9.1 \times 10^{-4}$ |
| Example 23 | 4.1 | 99.5 | 4.7 | 19.2 | 4.3 | 35.1 | $4.8 \times 10^{-4}$ |
| Example 24 | 4.0 | 99.4 | 5.3 | 3.0 | 5.0 | 45.4 | $5.7 \times 10^{-4}$ |
| Example 25 | 4.1 | 83.8 | 4.3 | 3.3 | 3.9 | 41.8 | $9.9 \times 10^{-4}$ |
| Example 26 | 3.9 | 91.5 | 5.4 | 2.8 | 5.0 | 48.8 | $8.7 \times 10^{-4}$ |
| Comparative example 21 | 4.1 | 96.8 | — | — | 3.8 | 48.9 | $3.1 \times 10^{-3}$ |
| Comparative example 22 | 4.1 | 99.3 | — | — | 3.8 | 49.2 | $2.4 \times 10^{-3}$ |
| Comparative example 23 | 3.9 | 97.2 | 4.4 | 24.3 | 4.0 | 25.1 | $8.9 \times 10^{-2}$ |
| Comparative example 24 | 4.0 | 97.4 | 3.7 | 2.5 | 3.7 | 47.1 | $9.6 \times 10^{-3}$ |
| Comparative example 25 | 4.0 | 98.2 | 4.5 | 24.3 | 5.0 | 23.3 | $8.7 \times 10^{-3}$ |
| Comparative example 26 | 3.9 | 99.1 | 4.2 | 22.7 | 4.0 | 28.3 | $2.8 \times 10^{-2}$ |
| Comparative example 27 | 3.9 | 89.2 | 4.5 | 23.6 | 5.0 | 25.6 | $5.4 \times 10^{-3}$ |

Having high gas barrier properties against water vapor and other gases, and being high in transparency and heat resistance, the gas barrier film according to the present invention can be used effectively for producing various products including, but not limited to, packaging materials for foodstuffs and pharmaceuticals and members of electronic devices such as thin-type TVs and solar batteries.

EXPLANATION OF NUMERALS

1. Polymer base film
2. Layer [A]
3. Layer [B]
4. Layer [C]
5. Polymer base film
6. Direction of conveyance
7. Wind-up chamber
8. Unwinding roll
9, 10, 11. Guide rolls for unwinding
12. Cooling drum
13, 14, 15. Guide rolls for winding
16. Wind-up roll
17. Electrode for surface treatment
18. Sputtering electrode
19. CVD electrode
20. First input gas supply nozzle
21. Second input gas supply nozzle
22. Sputtering chamber
23. First input gas supply chamber
24. Second input gas supply chamber

The invention claimed is:

1. Gas barrier film comprising a polymer base film laminated, on at least one of the surfaces thereof, with a gas barrier layer, the gas barrier layer having a layer structure in which a layer [A], a layer [B], and a layer [C], in contact with each other, are stacked in this order on the polymer base film, the layer [A] and the layer [C] each having a density in the range of 2.0 to 9.0 g/cm$^3$, and the layer [B] having a density that is in the range of 2.3 to 10.5 g/cm$^3$ and higher than the densities of the layer [A] and layer [C] and having a thickness of 0.2 to 20 nm, wherein the layer [A] and the layer [B] contain a zinc (Zn) compound as the primary component while the layer [C] contains, as the primary component, a compound containing at least one element selected from the group consisting of silicon (Si), aluminum (Al), titanium (Ti), zirconium (Zr), and chromium (Cr), the density of the layer [B] being higher by 0.1 to 2.0 g/cm$^3$ than the density of the layer [A].

2. Gas barrier film as described in claim 1, wherein the density of the layer [A] is higher than the density of the layer [C].

3. Gas barrier film as described in claim 1, wherein the density of the layer [A] is 3.9 to 4.6 g/cm$^3$; the density of the layer [B] is 4.0 to 5.8 g/cm$^3$; and the density of the layer [C] is 2.0 to 5.5 g/cm$^3$.

4. Gas barrier film as described in claim 3, wherein the layer [C] contains a silicon (Si) compound as the primary component and has a density of 2.0 to 2.6 g/cm$^3$.

5. Gas barrier film as described in claim 3, wherein the layer [C] contains, as the primary component, a compound containing at least one element selected from the group consisting of aluminum (Al), titanium (Ti), zirconium (Zr), and chromium (Cr) and has a density of 3.5 to 5.5 g/cm$^3$.

6. Gas barrier film comprising a polymer base film laminated, on at least one of the surfaces thereof, with a gas barrier layer, the gas barrier layer having a layer structure in which a layer [A], a layer [B], and a layer [C], in contact with each other, are stacked in this order on the polymer base film, the layer [A] and the layer [C] each having a density in the range of 2.0 to 9.0 g/cm$^3$, and the layer [B] having a density that is in the range of 2.3 to 10.5 g/cm$^3$ and higher than the densities of the layer [A] and layer [C] and having a thickness of 0.2 to 20 nm, wherein the layer [A] is either a layer [A1] or a layer [A2] as specified below:
   layer [A1]: a layer of a phase in which zinc oxide, silicon dioxide, and aluminum oxide coexist,
   layer [A2]: a layer of a phase in which zinc sulfide and silicon dioxide coexist.

7. Gas barrier film as described in claim 6, wherein the layer [A] is a layer [A1] as specified above and has a zinc (Zn) atom concentration of 20 to 40 atom %, a silicon (Si) atom concentration of 5 to 20 atom %, an aluminum (Al) atom concentration of 0.5 to 5 atom %, and an oxygen (O) atom concentration of 35 to 70 atom % as determined by ICP emission spectroscopy analysis.

8. Gas barrier film as described in claim 6, wherein the layer [A] is a layer [A2] as specified above in which zinc sulfide accounts for a mole fraction of 0.7 to 0.9 of the total for zinc sulfide and silicon dioxide.

* * * * *